(12) United States Patent
Fischione et al.

(10) Patent No.: US 7,132,673 B2
(45) Date of Patent: Nov. 7, 2006

(54) DEVICE AND METHOD FOR MILLING OF MATERIAL USING IONS

(75) Inventors: Paul E. Fischione, Export, PA (US); David W. Smith, Oakmont, PA (US); Michael R. Scheinfein, Portland, OR (US); Joseph M. Matesa, Murrysville, PA (US); Thomas C. Swihart, Pittsburgh, PA (US); David Martin, Dunbar, PA (US)

(73) Assignee: E.A. Fischione Instruments, Inc., Export, PA (US)

( * ) Notice: Subject to any disclaimer, the term of this patent is extended or adjusted under 35 U.S.C. 154(b) by 100 days.

(21) Appl. No.: 10/903,657

(22) Filed: Jul. 30, 2004

(65) Prior Publication Data

US 2006/0022148 A1    Feb. 2, 2006

(51) Int. Cl.
*H01J 37/08*    (2006.01)

(52) U.S. Cl. .................. 250/492.3; 250/492.2; 250/309; 250/311; 250/397; 250/452.21; 204/192.34; 204/298.36; 216/66; 216/94; 216/62

(58) Field of Classification Search ............... None
See application file for complete search history.

(56) References Cited

U.S. PATENT DOCUMENTS 5,104,684 A * 4/1992 Tao et al. .................. 427/526
6,730,237 B1 * 5/2004 Sievers et al. .............. 216/62
2005/0103746 A1 * 5/2005 Nadeau et al. ............. 216/62

OTHER PUBLICATIONS

Model 1010 Ion Mill, E.A. Fischione Instruments, Inc., downloaded from www.fischione.com.
Model 1010 Ion Mill, Tabletop precision ion milling and polishing system, E.A. Fischione Instruments, Inc., Part No. 009-1302, Rev. 0.
691 Precision Ion Polishing System (PIPS™), Gatan, Inc., downloaded from www.gatan.com.
Model 691 Precision Ion Polishing System, Gatan Inc.

* cited by examiner

*Primary Examiner*—Jack Berman
*Assistant Examiner*—Zia R. Hashmi
(74) *Attorney, Agent, or Firm*—Metz Lewis LLC; Barry I. Friedman

(57) ABSTRACT

A milling device is disclosed for the preparation of microscopy specimens or other surface science applications through the use of ion bombardment. The device provides the ability to utilize both gross and fine modification of the specimen surface through the use of high and low energy ion sources. Precise control of the location of the specimen within the impingement beams created by the ion sources provides the ability to tilt and rotate the specimen with respect thereto. Locational control also permits the translocation of the specimen between the various sources under programmatic control and under consistent vacuum conditions. A load lock mechanism is also provided to permit the introduction of specimens into the device without loss of vacuum and with the ability to return the specimen to ambient temperature during such load and unload operation. The specimen may be observed and imaged during all active phases of operation.

121 Claims, 19 Drawing Sheets

DEVICE AND METHOD FOR MILLING OF MATERIAL USING IONS

FIELD OF THE INVENTION

The present invention relates to an apparatus for the controlled removal of material from surface science technology or electron microscopy specimens as part of a specimen preparation technique. More specifically, the invention relates to a device including both high and low energy ion milling capabilities within a closely controlled environment, including, but not limited to, the parameters of specimen temperature, specimen location and vacuum. The invention further relates to a method for utilizing the disclosed device for the preparation of surface science technology or electron microscopy specimens.

BACKGROUND OF THE INVENTION

A charged particle instrument uses electrons that interact with a specimen to gain information from the specimen. Examples of such instruments are transmission electron microscope, atomic force microscopes, atom probe field ion microscopes and devices incorporating other scanned probe and x-ray technology for high magnification and imaging. Additionally, high angle annular dark field detections may be utilized in conjunction with such devices for high resolution scanning or transmission electron microscopy. In order for a specimen to be viewed using these devices, and more particularly, a transmission electron microscope, or TEM, it must have a portion or area that is electron transparent and atomically clean, meaning it is on the order of one atomic layer to 5 microns thick, depending on the material and the accelerating voltage of the TEM. One method of creating an electron transparent area in a specimen involves first mechanically reducing the size of the specimen in a gross fashion utilizing cutting, cleaving, thinning or polishing techniques, such as with a dimpling grinder or wedge polisher, and then ion milling the specimen. In ion milling, one, or preferably two, ion beams comprised of an inert gas, such as argon, are generated by an ion beam source or sources, otherwise known as ion guns, and are aimed at the mechanically reduced portion of the specimen. In some instances, corrosive beams may also be utilized for specific reduction or modification of the specimen material. Preferably, one ion beam is aimed at the top of the specimen at an angle of approximately 5–10° from horizontal, and a second ion beam is aimed at the bottom of the specimen at an angle of approximately 5–10° from horizontal. The ion beams remove material from the specimen by momentum transfer. Typically, ion milling is used to create a small hole in the center of the already mechanically thinned portion of the specimen such that the portions of the specimen adjacent to the hole are electron transparent. The ion beams used in conventional ion milling are on the order of 250 μm–2 mm in diameter, and have ion energies on the order of 0.5–10 keV, accomplishing material removal, or milling rates on the order of 20 μm/hr. Conventional ion milling has been accomplished utilizing lower energy devices, typically in the 50–100 eV range, but devices designed for this low energy utilization are frequently incapable of developing higher energies with appropriate current. Additionally, devices capable of higher energy, higher current milling cannot maintain a small beam diameter. These devices typically achieve a beam diameter as low as 1 mm, such as the Technoorg Linda Gentle Mill, manufactured by Technoorg Linda, Budapest, Hungary.

Another device used to prepare specimens is a focused ion beam, or FIB. FIB milling was originally developed for circuit editing in the semiconductor industry to cut and weld traces. In FIB milling, a small diameter, high energy ion beam is generated from a liquid metal source. Typically, the diameter of the ion beam is on the nanometer scale and the energy of the beam is on the order of 5–30 keV. In light of its small beam diameter, FIB milling may be used for very fine cutting applications. Additionally, because of this fine cutting capability, focused ion beam etching has also been used for other specimen preparation to create the electron transparent area. For example, FIB milling is often used to create TEM specimens from processed microelectronic wafers. One common example of such use of the FIB technique is known as an H-Bar sample. In an H-Bar sample, two trenches, approximately 20 micron wide, are cut into the top and bottom of a cleaved or ground section of a wafer, leaving an electron transparent area between the trenches. One problem with focused ion beam etching as used in TEM specimen preparation is, because of the high ion energy and/or mass, the FIB processes often damage the crystalline structure of the specimen, thereby causing amorphization. In addition, the metal ions tend to penetrate the specimen substrate, a condition known as implantation. Amorphization and implantation both adversely affect the quality of the TEM image that may be obtained from the specimen. Conventional ion milling may be used to remove or remedy some of this amorphization and implantation. However, because the ion beam used in conventional ion milling is typically on the order of 1 mm and the trenches in an H-Bar sample are on the order of 20 microns, the ion beam will often remove some specimen material from the edges surrounding a trench and deposit that material in the trench. This problem, known as redeposition, also adversely affects the quality of the TEM image obtained from the specimen.

A variety of other methodologies are utilized either with or without the use of a FIB. These include grinding and polishing a specimen into a relatively thin, wedge shaped orientation, which may then be viewed at the thin edge of the wedge or carved directly from the face of a substrate utilizing the FIB. In one particular methodology, a thin slice of material is removed from a solid substrate by removing a trench of material immediately adjacent the thin slice or section of the substrate material to be viewed. The thin slice is protected during the milling of the trench and is subsequently removed once the area around it has been cleared by cutting the thin, roughly rectangular section away from the surrounding substrate walls.

In any of the previous examples of specimen preparation, the use of mechanical grinding and cutting techniques, as well as cutting and thinning through the use of the FIB, results in relatively localized amorphous damage to the specimen as described above. A number of techniques have been utilized in the prior art to alleviate both the creation of the damage to the specimen during its initial preparation, as well as remove the damage created by that preparation. Such techniques include the use of gas plasma, as disclosed in Fischione, U.S. Pat. No. 5,633,502. Various alternative preparation techniques, as described above, have further been developed for the purpose of exposing an appropriate area of interest of the specimen in such a manner that the physical separation of the sample section containing the area of interest from the surrounding substrate layer and the thinning of the sample take place in an area spatially removed from the particular area of interest.

As will be apparent to those skilled in the art, the use of lower energy ions for less abrasive mechanical techniques would minimize specimen damage, however, the ability to solely utilize these techniques while retaining a reasonable preparation time and treating a given area of the specimen without redeposition has not been resolved.

The requirement of electron transparency therefore necessitates the utilization of some electrical, chemical, thermal or mechanical preparation methodology before the exposure of the surface at the precise area of interest. Prior ion milling devices have been utilized in a variety of ways to achieve these same purposes. Typical ion milling energies and prior art devices, however, range from 0.5 to 10 keV. Alternative methodologies for reducing the impact damage of such traditional ion sources include the use of milling at low angles in order to reduce the direct impact of the ions utilized for milling on the specimen surface and for the more careful and controlled removal of specimen material from that surface. Ion Mill Model No. 1010, currently manufactured by E. A. Fischione Instruments, Inc. of Export, Pa., is a typical example of the prior art mill. It incorporates the use of hollow anode discharge, or HAD, ion sources, which are mounted adjacent to a tilting and rotating specimen stage. The use of the tilting and rotating specimen stage allows for the manipulation of the specimen relative to the HAD ion sources and for projecting and moving the ion beam across the surface of the specimen. While ion mills of the prior design have been effective, new developments in nanotechnology, electron microscopy and the continued sub-miniaturization of the specimen areas of interest have necessitated further improvements in both the magnification power of the transmission electron microscopes as well as the need for reduction of specimen damage during preparation. At higher levels of magnification, the damage from prior art preparation techniques threatens not only to overwhelm the field of view in specimen imaging, but also to produce a variable and unpredictable modification of the specimen structure. What is lacking in the art, therefore, is a methodology of thinning a specimen to electron transparency which provides both time efficient gross specimen preparation and thinning capability, and finely controlled finishing capability, while minimizing damage to the specimen through the use of both high and low energy ion beams having a relatively small beam diameter.

What is further lacking in the art, moreover, is the ability to prepare the specimens with minimal damage utilizing a variety of techniques or devices under carefully controlled conditions of temperature and vacuum. A number of devices are currently identified in the prior art which provide many of the features identified above, but which are provided only in discreet implementations or devices without regard to the condition of the specimen being transferred between such preparation devices or intermediate such techniques.

SUMMARY OF THE INVENTION

An ion mill is described which provides the capability of preparing a specimen utilizing a variety of low and high ion beam energies, while maintaining a relatively small beam spot size or diameter. The use of a small beam spot size minimizes the amount of sputtered material which may be re-deposited on the specimen surface and further promotes the ability to raster the beam across the surface of the specimen. Moreover, the operations are conducted within a single vacuum space, minimizing the effects of exposure of the specimen to ambient environmental conditions and contaminants.

The device includes computing capabilities, which permit both centralized control of the various components of the device, as well as the programmatic control of those components for automated processing, both locally and over a network. While a Windows-based PC is preferably utilized for this function, any computing device may be utilized, including customized solutions. Alternative input and output functionality may be incorporated such as touch screens or dedicated display panels. Additionally, if purely manual operation is deemed appropriate, the computing device can be eliminated and the controls and outputs of the various components may be individually controlled through appropriate discrete components, as will be evident to those skilled in the art.

A chamber housing forms the primary structural component of the operable device. This chamber housing may be mounted on any type of suitable support, with a transportable cabinet being preferred. The operative sections of the milling device may, however, be mounted on a bench or any other support with the requisite stability. The chamber block is itself comprised of a number of component structural parts, and may be subdivided for ease of manufacture, service or assembly. It is constructed of such material, preferably aluminum with requisite strength and other mechanical and chemical properties to support the components mounted thereon, as well as the milling activities within.

The chamber block is the locus of the milling functions of the ion milling device and is provided with imaging capability for the purpose of observing the progress of the milling and beam targeting operation conducted therein. While a variety of imaging devices may be utilized in conjunction with the milling operations, including optical, thermal, electro-optical, scanning, or other microscopic capabilities, the high energy function is preferably observed utilizing a CCD camera, while the low energy operation is observed utilizing a secondary electron detector or SED, imaging module.

The high energy milling function includes at least one and preferably a plurality of HAD ion sources, which may be utilized individually or in combination. Although the HAD devices are preferred at this time, it is specifically contemplated that other high energy milling devices might be incorporated directly within the milling device, including, but not limited to a FIB or other liquid metal source device. The HAD or other high energy devices are supplied utilizing a gas, which may be inert for providing a cleaning function, or corrosive, for providing a selective etching function. In the preferred embodiment, the inert gas is preferably argon. In addition to the high energy milling capability of the device, the combined ion milling device further includes low energy milling capability, which is utilized for the more controlled removal of specimen material.

The low energy source is designed as a self-contained unit which incorporates rods to support and space a filament assembly in an appropriate orientation for interface with the remaining components of the low energy source. The lens assembly is positioned directly adjacent to the filament assembly at the lower portion of the filament section and is separately supported thereby in this fashion. Optionally, the filament assembly may be removed alone, or the lens assembly may be removed in conjunction with the filament assembly and the two assemblies may be separated external to the ion milling device for service and access to the various component parts. The elements of the ion source and lens include a gas fitting for the insertion of inert gas to a point adjacent to the filament element. A series of electrodes is disposed circumferentially about the base of the filament and contains a bore for the electrons originating from the filament to pass therethrough, as well as to provide for the acceleration of the ions to the lens device. Once the ions emerge from the aperture of the source, they are directed into a lens which is preferably provided with a conical bore. The lens includes rastering or deflecting segments at its terminal end to permit scanning of the ion beam across the surface of the specimen. Specimen induced current for endpoint detection—use faraday cup adjacent beam to measure transmitted current far side of specimen to sense presence The milling device is also provided with a plurality of methods for end point detection and observation during the milling process, primarily provided by the use of a light source positioned for direct impingement on the specimen. The detection of the light source through the specimen during the milling process indicates that a milling endpoint is anticipated, if not already achieved. Other forms of endpoint detection may also be incorporated which do not utilize direct impingement of a beam through the specimen. These include methods and devices which utilize a sensor, such as a Faraday cup, mounted adjacent the path of the ion beam passing through the specimen to detect the presence of the beam on the opposite side of the specimen from the beam source.

A specimen positioning module, or carriage, provides a stable cradle for the support and positioning of a dewar for retaining liquid nitrogen or other cooling media, together with an armature for supporting the specimen holder and heat transfer. Although a dewar-based system is preferred, other cooling systems may be interchanged with similar results, such as a Peltier cooler module. Mechanically, these alternative modules would be interchangeable with the dewar system, other than the adaptation of the specimen positioning module to support the alternative device, which would be well within the ability of those skilled in the art. The positioning module controls and supports the movement of the specimen with respect to the ion milling sources, together with the attendant accessories necessary to support and monitor the specimen during the operations. The positioning module is displaced laterally utilizing a motor-driven lead screw assembly. The positioning module is guided by support rods and engages the lead screw drive. Control of the drive motor converts lead screw rotation into module translation. The positioning module is displaced rotationally about the lateral module axis for tilting of the specimen into the ion beam paths. A motor fixed to the chamber, engages a gear which is attached to the module and provides complete module tilt. All motion limits of the positioning module are defined using sensors which indicate both the ends of travel for translation, and a center-of-rotation home position for tilt. All intermediate positions are defined in software relative to the limits and controlled by stepper or encoder based motor drives. While the preferred embodiment allows for the lateral positioning of the specimen, together with the ability to tilt and rotate the specimen with respect to the ion beam, it is to be specifically understood that additional manipulations of the specimen may become useful or necessary in future embodiments, including, but not limited to tilting of the specimen along a second, front-to-back axis, normal to the side-to-side tilting function described above, as well as the ability to raise and lower the stage from the plane containing the lateral movement and side-to-side tilt axis of rotation.

A vacuum pump module provides vacuum pumping functionality for the vacuum chamber. The vacuum pump module may be of any conventional design, and is typically constructed of commercially available devices. The primary pumping capability is preferably provided by a turbomolecular pump. As will be apparent to those skilled in the art, appropriate seals are provided between each of the modules and components associated with or mounted on the chamber block in order to facilitate the maintenance of a vacuum therebetween.

The specimen stage is both structurally and thermally affixed to the dewar containing the cooling media. The specimen is typically milled under cooling conditions, so as to prevent degradation from the heat caused by the impingement of the ion beam. A thermally conductive support extends from the positioning module support structure, which is located outside of the chamber block to the vacuum chamber contained therein, which is the site of all milling and imaging activity. The specimen stage assembly is, however, able to be temporarily disengaged from its thermal connection to the cooling system. The thermally conductive support receives the specimen stage in a slidable engagement which is resiliently biased toward engagement with the cooling system, preferably by a spring. When loading or unloading specimens, however, the stage is forced against the spring and moved into a disengaged position, allowing the specimen and holder to return to an ambient temperature. This process may also be facilitated by a heater built into the stage.

The device is further provided with the ability to insert and remove specimens into the vacuum chamber without need of releasing and recreating the high vacuum state of the chamber. A load lock is utilized to introduce the specimen to the vacuum chamber. It is also specifically contemplated that the device may be utilized in conjunction with a vacuum-based specimen transfer device which may externally mate directly to the load lock. The specimen may be removed from the holder to the transfer device under vacuum and transported to the microscope or other imaging device without exposure to the atmosphere or other environmental contaminants. The load lock vacuum, as described more fully herein, may also be utilized to maintain or support the vacuum within such transfer device.

When the specimen stage is moved into a load/unload position, it extends from within the vacuum chamber into the load lock. The stage is designed to seal off its sample holder extending into the load lock from the vacuum chamber. The engagement of the stage with the load lock in this position also disengages the thermal connection between the stage and the cooling system. The load lock may then be vented and opened, exposing the end of the specimen stage while maintaining the vacuum within the chamber. After sample exchange, the load lock may then be pumped down and the stage retracted into the primary chamber. Retraction into the chamber automatically re-engages the thermal coupling to the cooling system.

The specimen stage itself contains, in addition to the heater described above, a temperature sensor for monitoring the temperature of the specimen stage. The specimen stage supports the specimen itself in a clamping, rotational holder, which can be rotated upon remote command through the use of a small motor within the stage. Additionally, the motor or a pump device may be mounted external to the stage and provide mechanical energy to the stage or holder through mechanical or pneumatic communication. The holder is removable to allow for multiple holders, of potentially differing geometries or design, to be utilized in conjunction with the device. The preferred embodiment, adapted for TEM specimen milling, utilizes a riser which suspends the specimen over a gap which permits the milling of the underside of the specimen. Additionally, the specimen holder permits the passage of end detection illumination therethrough.

Additionally, the stage may be adapted for receiving and supporting multiple specimens, typically in a carousel arrangement rotated through the use of an additional motor supporting a turntable-like support which would, in turn, support the various holders mounted thereon.

A computing device, which is preferably a Windows-based PC, may be provided to control and monitor the operational aspects of the milling device. This includes the location and manipulation of the specimen through the various positioning devices, the vacuum systems, the imaging systems and the ion milling devices. It is also anticipated that all functions may be independently controlled and monitored through the use of discrete manual devices. The computing device, if present, may also be utilized to create and execute programs for the automated control and sequencing of the device processes. A graphical input/output interface is preferably utilized in conjunction with the computing device to simplify the operability of the device and further provides a convenient and compact locus for all control and output, typically in conjunction with a keyboard and/or pointing device. The various screens and menus provided in conjunction with the interface permit the full control of all mechanical and milling operations of the device, together with graphical, pictorial or other data output from the various sensors and imaging devices. As is customary with such computing devices, connection to a network may be utilized to exchange data, images or operational controls between interconnected computing devices. Remote operation of the computing device, including the ability to perform diagnostic functions, is also anticipated in such an embodiment, as would be well known to those skilled in the art.

A feature of the device is the ability to perform pre-defined automated milling sequences. A specimen may be grossly thinned utilizing the high energy ion mill module and then finished utilizing the low energy ion mill module. The milling parameters are defined by the user, and may be manually or programmatically controlled, including movement of the specimen with respect to the ion beams during the milling operations. At the initiation and conclusion of milling operations, the specimen stage is returned to the load/unload position and the load lock mechanism is engaged. In this manner, a sequence of specimens may be processed through combined milling mechanism without the need to recreate the vacuum conditions within the vacuum chamber.

These and other advantages and features of the present invention will be more fully understood upon reference to the presently preferred embodiments thereof and to the appended drawings.

DESCRIPTION OF THE PREFERRED EMBODIMENTS

Figure 1:
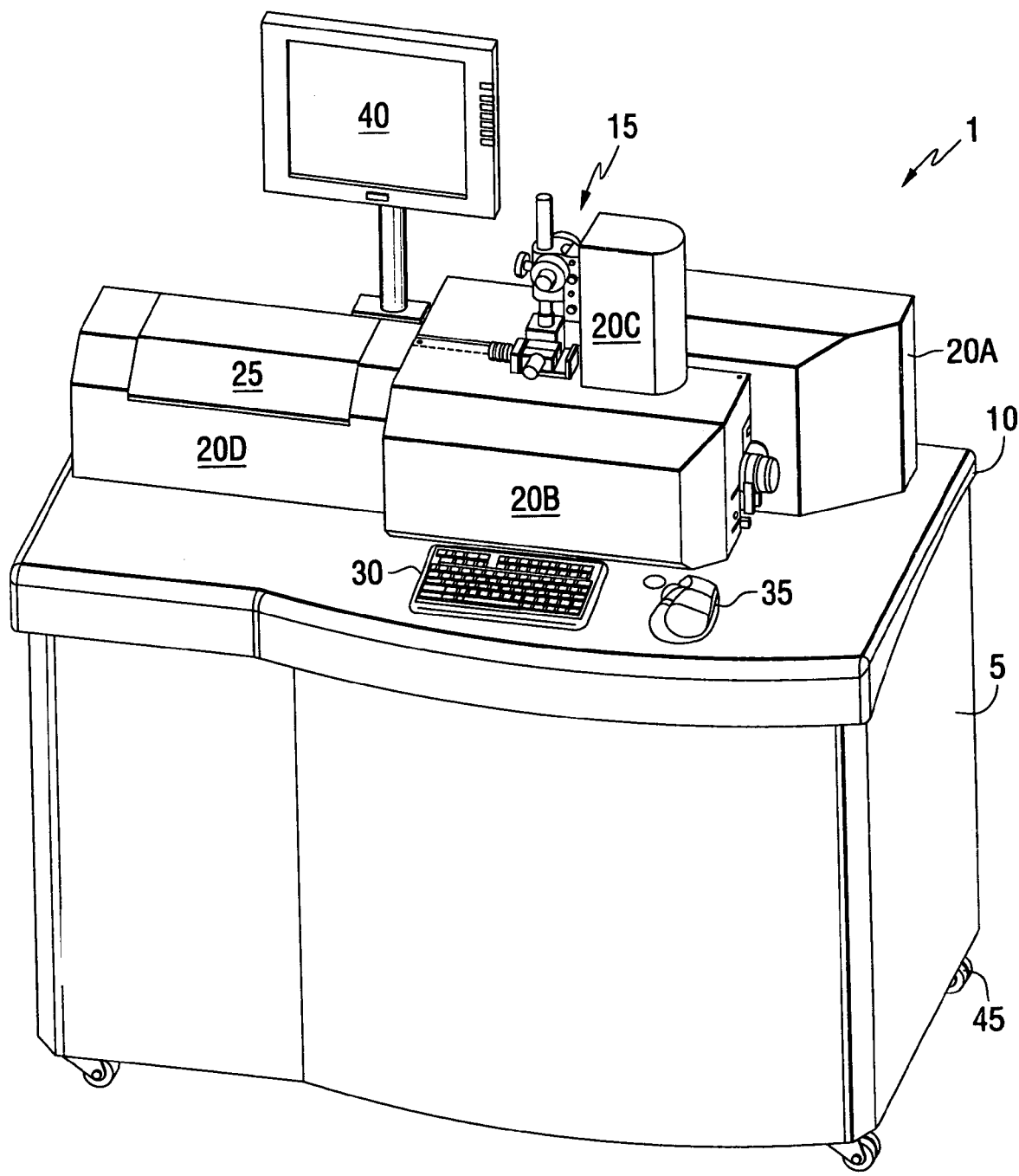
FIG. 1 is an elevational isometric view of the combined ion milling device.
Figure 2:
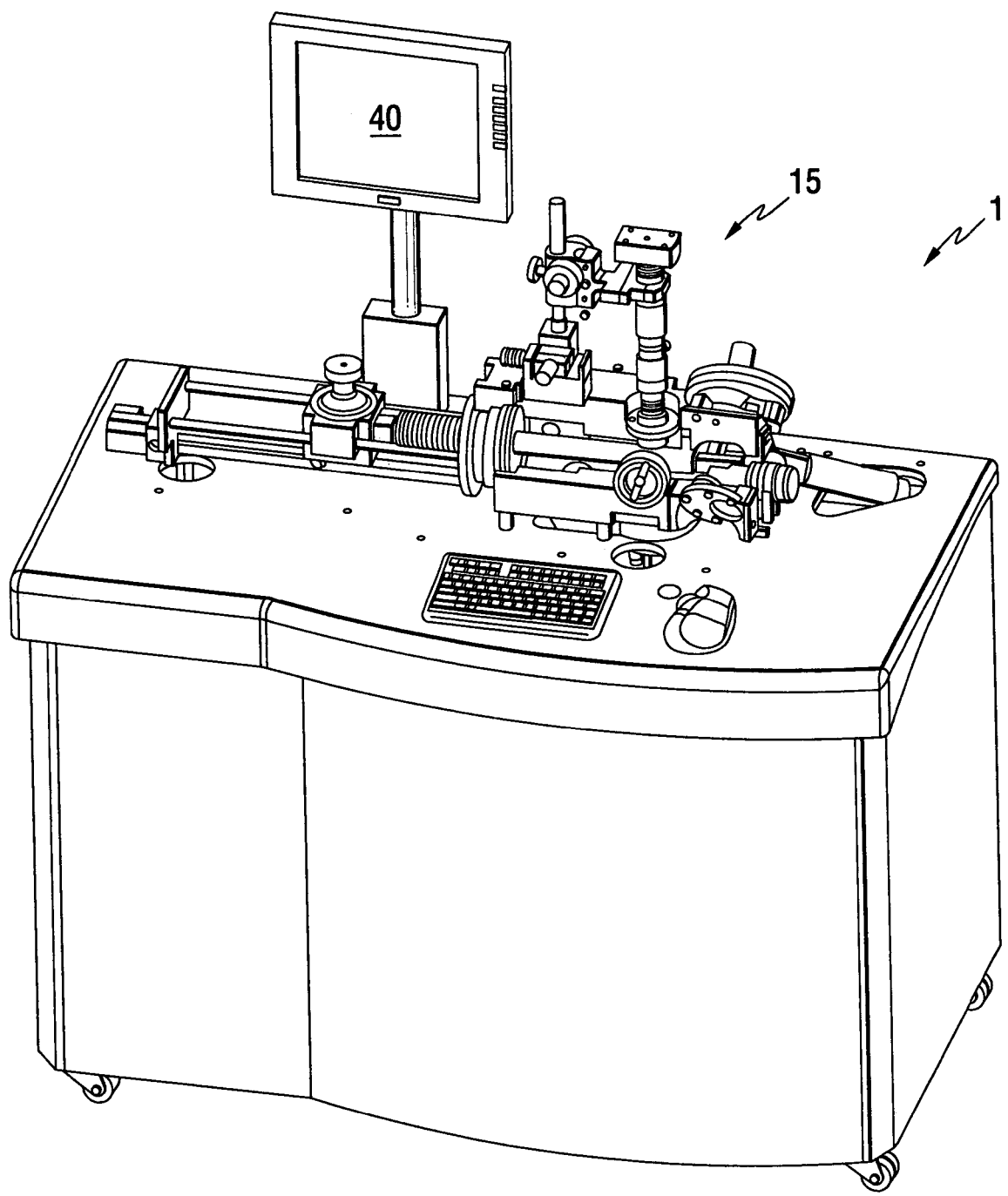
FIG. 2 is an elevated isometric view of the combined ion milling device having all operational covers and shields removed to expose the internal mechanism.

Referring now to FIGS. 1 and 2, an ion mill 1 is shown having a base cabinet 5, which is utilized to support the operable equipment and to enclose the power supply, vacuum system and circuitry utilized in the device. Base cabinet 5 includes a plurality of removable or openable panels to provide access to the internal components and storage spaces. The cabinet includes a counter top 10, which is made of an inert and durable material, which will withstand both physical and chemical abuse or attack while in use in a laboratory setting. In operation, the combined milling mechanism 15 is provided with covers 20A through 20D, which are utilized to provide both an aesthetically pleasing exterior surface, as well as protection for the relatively delicate device components. Each of the covers 20A through 20D provides removable access to these components for repair or inspection. A dewar access panel 25 is provided as a readily openable or removable cover to permit easy access to the internal mechanism for replenishment of the liquid nitrogen cooling media utilized within the device, as will be described later.

A computing device, including processor, memory and data storage means, is incorporated within the device for all logic control and data output as will be more fully described with reference to FIGS. 14 and 15. A Windows-based PC is preferably utilized for this function. The primary components of which are mounted inside cabinet 5. Keyboard 30, pointing device 35 and screen 40 are positioned exterior to cabinet 5 in order to provide user input and data output. While data input and output are necessary for the utilization of the device in an effective manner, it should be specifically noted that the methodologies of input and output are to be considered optional within the scope of the art and the utilization of alternative input and output methods are clearly contemplated. The cabinet 5 is optionally provided with casters 45 or other alternative cabinet support devices in order to position the cabinet 5.

Figure 3:
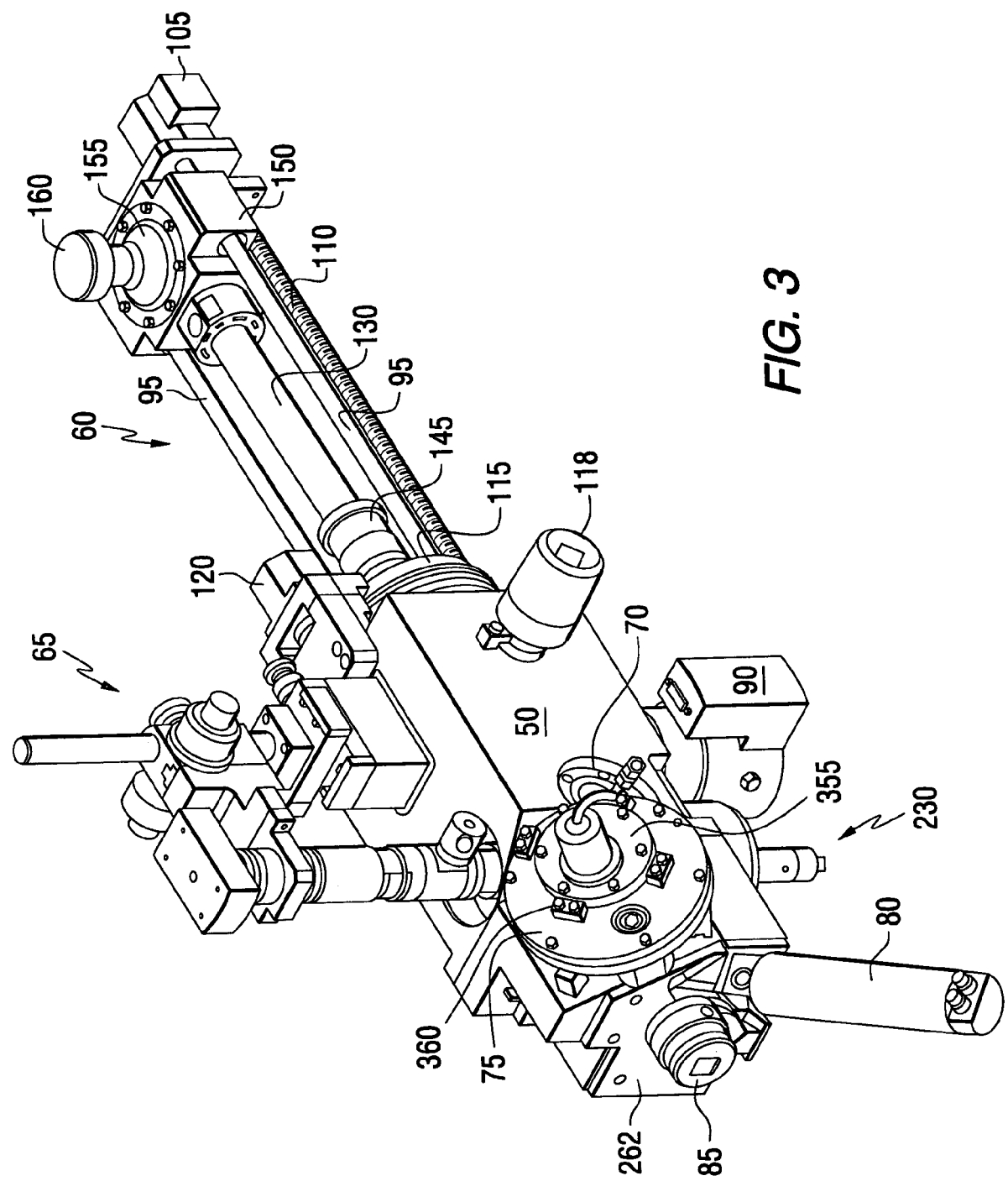
FIG. 3 is an isometric view of the core operational components of the combined ion milling device.
Figure 4:
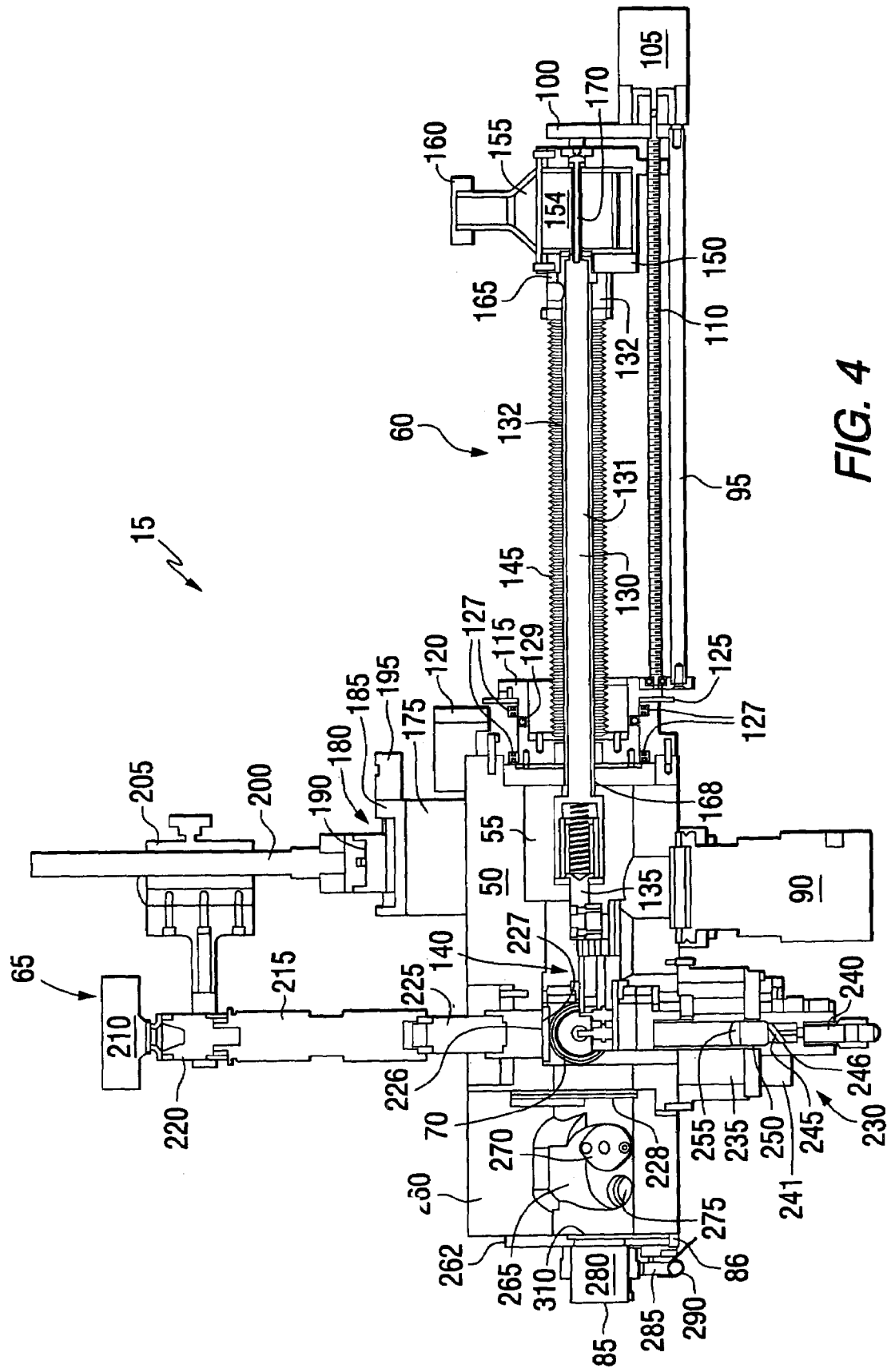
FIG. 4 is a longitudinal sectional view of the combined ion milling device.
Figure 5:
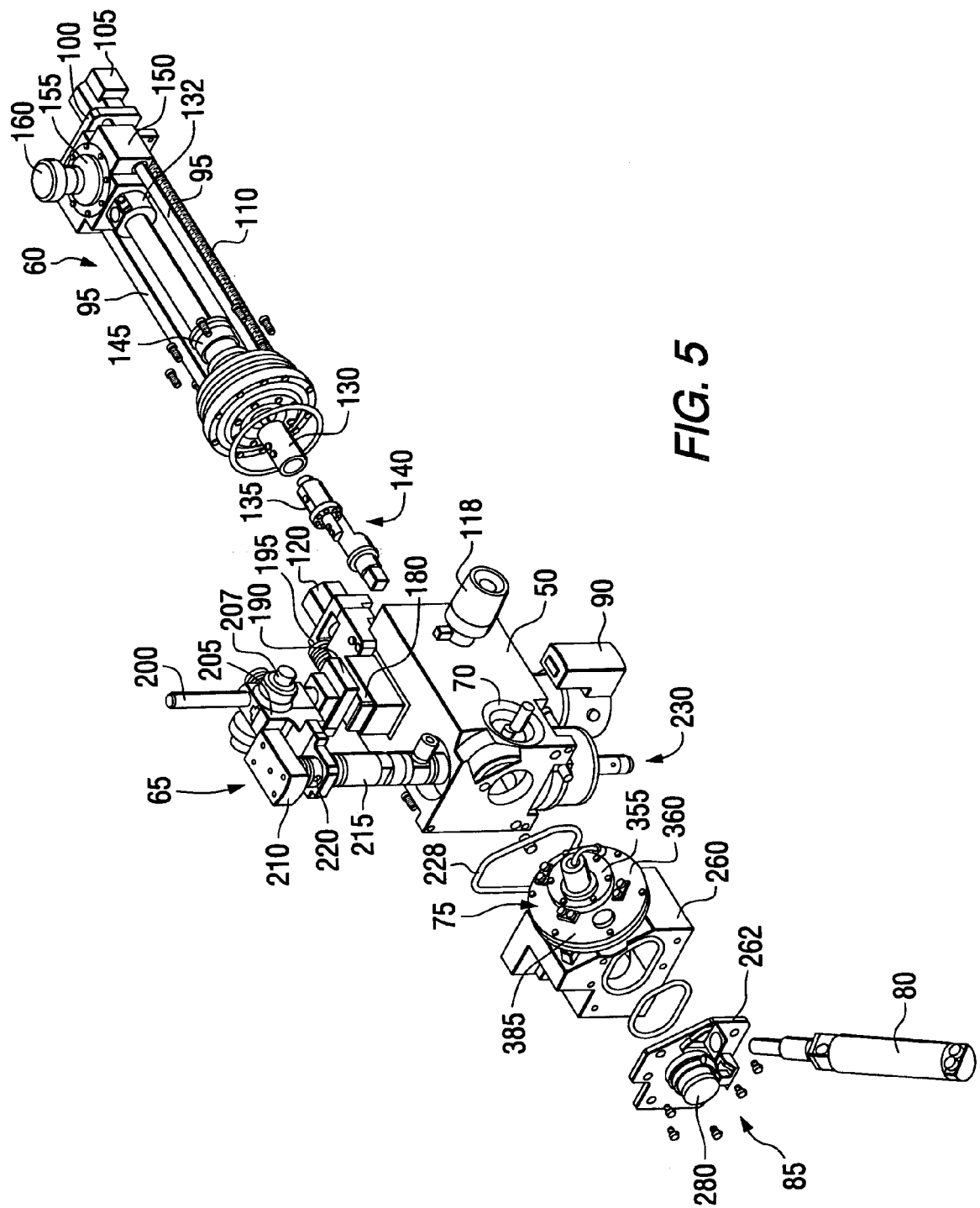
FIG. 5 is an isometric exploded view of the combined ion milling device.

Referring now to FIGS. 3, 4 and 5, the main chamber block 50 is provided, which in conjunction with low energy ion source mounting block 260 provides the majority of the vacuum chamber of the combined device. Chamber block 50 is preferably constructed of milled aluminum but may optionally be constructed of any material comprising similar strength and compatibility with the ion milling function contained therein. Additionally, the materials utilized in the device may need to be modified in the event that corrosive gasses are utilized, as would be apparent to those skilled in the art. Chamber block 50 contains vacuum chamber 55 in which specimen positioning module 60 is utilized to introduce and position specimen stage module 140. Vacuum chamber 55 is provided with such size and dimensions as will permit the free introduction of the various componentry while maintaining a sufficient wall thickness within chamber block 50 to permit the necessary vacuum conditions specified herein. Chamber block 50 is further the locus of the high energy milling function of the ion milling device and is provided with CCD imaging module 65 for the purpose of observing the progress of the high energy milling conducted within chamber block 50. The high energy milling function is provided utilizing high energy ion milling module 70, which includes at least one and preferably a plurality of preferably hollow anode discharge ion sources. These conventional HAD devices are generally identical in function and similar in construction to those found on the Model 1010 Ion Mill produced by E. A. Fischione Instruments, Inc. of Export, Pa. The high energy ion mill module preferably comprises two fixed position HAD ion sources having ion beam energy variably and continuously adjustable within the range of 0.5 to 6.0 keV. This energy level is derived from an ion source current, which is also continuously variable and adjustable between 3 mA and 10 mA. The HAD sources may be utilized individually or in combination, and can develop a beam current of up to 400 uA/cm$^2$ with a spot size of as low as 1 mm, achieving material removal rates of approximately 20 μm/hr. The HAD devices are typically supplied utilizing an argon gas supply which should be well-known to those skilled in the art. In the event that corrosive gasses are utilized, it is contemplated that supply components would typically include the use of stainless steel and PTFE. In normal use, the HAD devices consume approximately 0.4 sccm of gas. As with the prior art devices, the high energy ion mill module 70 is held in a fixed position while the specimen is manipulated within the field of the fixed beam while some other prior art devices hold the specimen in a fixed position while manipulating the ion sources In addition to the high energy milling capability of the device, the combined ion milling device further includes low energy ion mill module 75, which is utilized for the more controlled removal of specimen material, as will be described more fully herein. As with the high energy module, the low energy module is provided with imaging capability so that the specimen may be observed during the milling procedure. Provided for this functionality is secondary electron detector or SED, imaging module 80, which, like the low energy ion mill module 75, is fixed in a position extending into the low energy ion source mounting block 260. It is to be specifically noted that any optical, thermal, electro-optical or electronic imaging device, may be substituted for the SED, dependent upon the application. Low energy ion source mounting block 260 is further provided with low energy milling chamber 265, which, similar to vacuum chamber 55, is sized and positioned within low energy mounting block 260 such that an appropriate vacuum may be maintained therein, while preserving enough operating space for the equipment and specimen holders inserted therein. Chamber structure assembly 228 is further provided to separate and screen the components of vacuum chamber 55 and low energy milling chamber 265. A motorized divider, best viewed in FIG. 4, is selectively positioned to extend into and divide the two chambers during operation of high energy ion mill module 70. Low energy ion source mounting block 260 is further provided with an endplate 262 which closes and seals the low energy milling chamber 265 and further supports load lock 85. Load lock 85 is utilized to introduce the specimen to the specimen stage module 140 when in the appropriate load position, as will be described more fully herein. Load lock 85 provides controlled ingress and egress of the specimen stage module 140 and access thereto from the outside environment.

Specimen stage module 140 is supported by specimen positioning module 60, which in itself is comprised of a number of support elements. Specimen positioning support rods 95, of which there are preferably at least three, are mounted in conjunction with specimen positioning support flange 100 to provide a stable cradle for the support and positioning of dewar 155 and its attendant mechanisms. Lateral displacement motor 105 is mounted on specimen positioning support flange 100 and is engaged with threaded drive rod 110, which runs parallel to specimen positioning support rods 95. Lateral displacement motor 105 is preferably a stepper- or servo-type motor having movement control on the order of ±1 degree. A rotational support housing 115 is provided in conjunction with specimen positioning support rods 95 and specimen positioning support flange 100 to form the complete cradle, which will support dewar 155 and its attendant mechanism. In operation, the lateral movement of dewar 155 is controlled by the interface between threaded drive rod 110 and dewar support housing 150. Dewar 155 is provided with a removable dewar cover 160 and is encased in dewar support housing 150. Dewar support housing 150 is supported by and is slidably mounted upon specimen positioning support rods 95 and threadably engages threaded drive rod 110. The controlled rotation of lateral displacement motor 105 rotates threaded drive rod 110, thus laterally displacing, through the threaded engagement between threaded drive rod 110 and dewar support housing 150, the movement of dewar 155, as will be discussed subsequently. The movement of dewar 155 further controls the movement of specimen stage module 140 through primary specimen support 130.

Specimen positioning module 60, including dewar 155 and specimen stage module 140, is axially or rotationally displaced for tilting of the specimen positioning module 60, as well as the specimen itself, within the various ion sources, by the use of rotational displacement motor 120, as will be described more fully herein. Rotational displacement motor 120 engages rotational gear 125, which is mounted at the periphery of rotational support housing 115. Rotational displacement motor 120 is preferably a stepper motor or servo motor having movement control of approximately ±0.1 degree, within an operable range of 0 to 45 degrees. In operation, the movement of rotational displacement motor 120 engages rotational gear 125 which accomplishes the tilting of the entire specimen positioning module 60 as a unit, in accordance with the gear ratio of their coupling. A more precise description of the operation and tilting of specimen positioning module 60 will be described further with references to FIGS. 6, 7 and 8.

Referring now to FIGS. 3, 4, 5 and 14, a vacuum pump module 90 provides vacuum pumping functionality for vacuum chamber 55 and low energy milling chamber 265.

Vacuum pump module 90 is preferably a turbomolecular pump 91 such as the Model No. TMPO71 manufactured by Pfeiffer Vacuum Technology AG, of Asslar, Germany, backed by a roughing pump 92 which may be of any known type, as will be apparent to those skilled in the art. Pumping systems of this type are similar, if not identical, to those systems found in the Model 1010 Ion Mill and Model 1020 Plasma Cleaner manufactured by E. A. Fischione Instruments, Inc. of Export, Pa. While the vacuum pumping system may be of any type suitable to develop a vacuum of $10^{-5}$ torr, the vacuum system is preferably of an oil-free design in order to minimize any potential oil contamination of the specimen. In certain circumstances, however, the use of an oil based system may be incorporated. The precise application of the combined ion mill will dictate to those skilled in the art, which vacuum system should be applied. Also apparent to those skilled in the art, are the appropriate seals to be provided between each of the modules described above in order to facilitate the maintenance of a vacuum between the various mounting blocks and components. While such seals are preferably of an O-ring construction, it is to be specifically contemplated that a variety of other sealing devices or techniques may be applied.

Referring again to FIGS. 3, 4 and 5, imaging of the specimen during high energy milling is accomplished using CCD camera 210, which is supported by CCD lens adapter 220, which is itself supported by CCD camera support block 205. CCD lens 215 provides zoom capabilities for adjustable imaging of the specimen. The focus of CCD camera 210 is accomplished by vertical movement of camera 210, as will be described herein. CCD camera 210 and CCD zoom lens 215 are preferably manufactured by Mitutoyo of Kanagawa, Japan. CCD objective lens 225 is utilized to create the image for CCD camera 210 through CCD zoom lens 215. Objective lens 225 is vertically displaceable with respect to the specimen for focus of the image, while CCD zoom lens 215 is utilized to adjust the magnification of the specimen's image on the CCD element within camera 210. Protective window 226, preferably constructed of sapphire, is utilized to separate the vacuum chamber 55 from the lens 225 and camera. A motorized lens shutter assembly 227, of conventional design, may be utilized to cover protective window 226 during milling processes when imaging is not necessary, in order to prevent build-up of sputtered material on the face of protective window 226. CCD camera 210 is positioned laterally through the use of a multipart mounting block system. CCD imager mounting block 175 is directly positioned on chamber block 50 and is provided with a sliding track on base block 185, which is adjustable utilizing adjustment knob 195 for the controlled movement thereof in a first dimension along the longitudinal axis of the entire device. CCD imager positioning block 180 is a multipart section which includes a sliding block 190 which is adjustable in a second dimension normal to the movement of CCD imager positioning block 180. The combination of blocks 180, 185 and 190 permit the positioning of CCD camera support rod 200 in any one of a number of infinitely variable fixed positions for the ultimate positioning of CCD camera 210 within the optical field necessitated by the movement of specimen holder module 140 during operation. CCD camera support block 205 is slidably and lockably mounted on CCD camera support rod 200 to permit the appropriate height and focus adjustment of CCD camera 210, utilizing height and focus adjustment knob 207.

The milling device, in conjunction with the high energy milling section, also provides a plurality of methods for end point detection and observation during the milling process. This is primarily provided by end point detection module 230. End point detection module 230 comprises a light source mounting block 235, which is affixed directly to chamber block 50. Light sources may be positioned for either direct impingement on the specimen as shown with end point detector light source 240, which is preferably a laser, or axially, for impingement utilizing a mirror 245. Either will project light through lens 255 and be focused upon the underside of the specimen by passing through specimen holder module 140 as will be further described. End point detection is achieved by the passage of the laser beam of light source 240 through the nearly perforated specimen by CCD camera 210. Referring now to FIGS. 4 and 14, a secondary axial visual light source 241 may be positioned external to the device, with access through light port 246 to impinge upon mirror 245. Spring 250 is utilized to support lens 255 within the bore of end point light source mounting block 235. Such secondary visual light sources 241 are typically utilized for assisting in the visual inspection of the milling progress upon the specimen.

A chamber vacuum gauge 118 is provided for monitoring of vacuum conditions within vacuum chamber 55.

Figure 6:
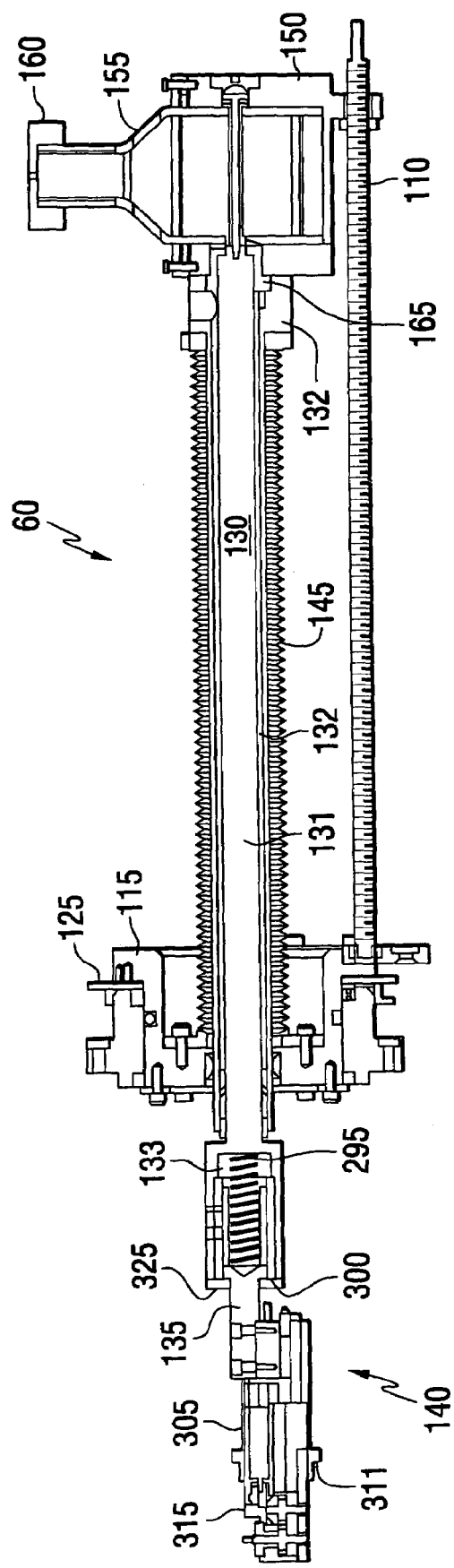
FIG. 6 is a longitudinal sectional view of the specimen positioning module of the combined ion milling device.
Figure 7:
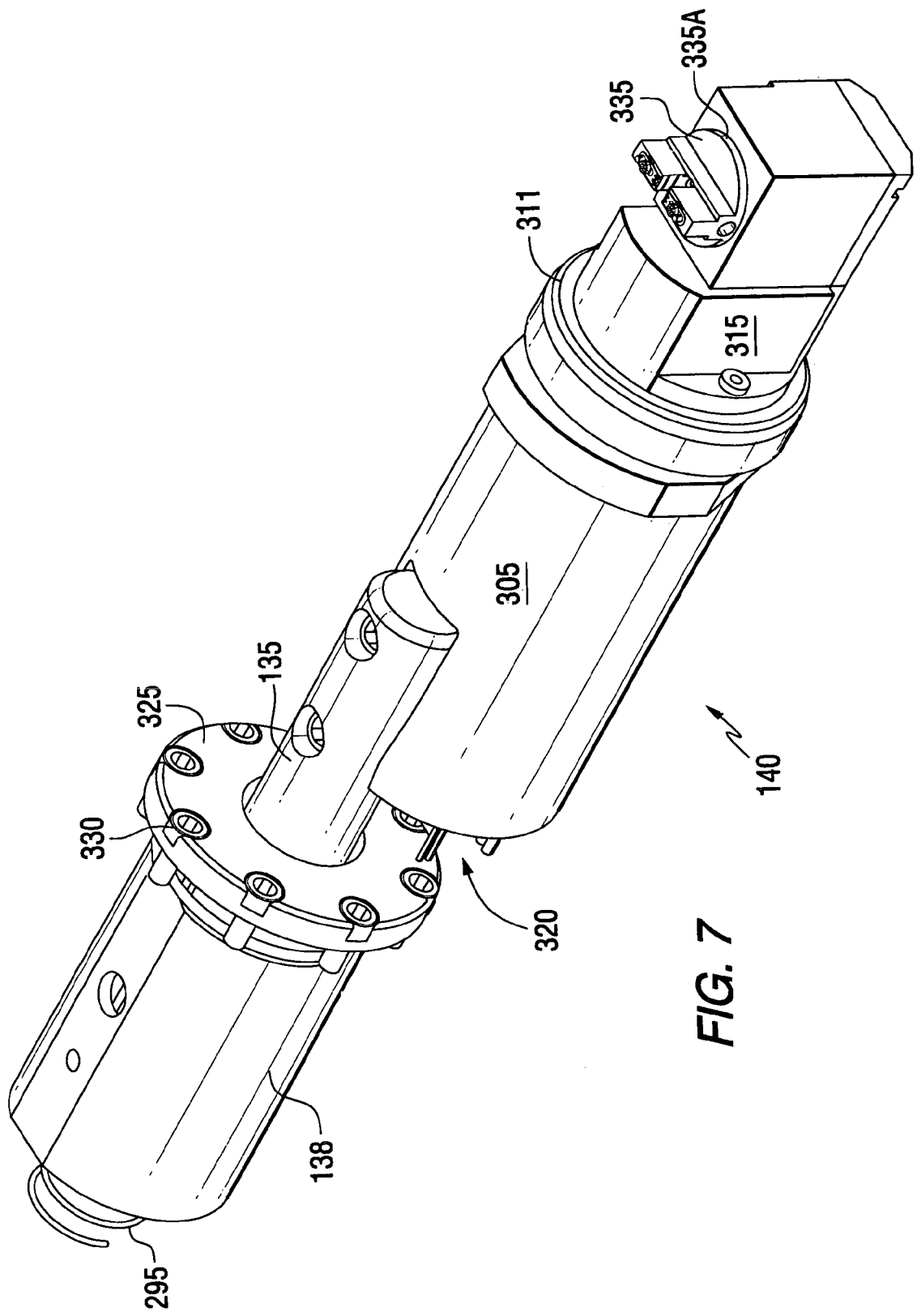
FIG. 7 is an isometric view of the specimen stage module of the combined ion milling device.

Referring now to FIGS. 4 and 6, specimen position device 60 is mounted directly in an appropriate bore contained in chamber block 50, which is adapted to receive and restrain the tilting motion of specimen position module 60 through rotational support housing 115. Support housing 115 is supported within the bore on bearings 127 and vacuum is preserved within vacuum chamber 55 through the use of seal 129 interposed between rotational support housing 115 and the bore provided within chamber block 50. Rotational support housing 115, in conjunction with rotational displacement motor 120, are provided with center position detection means not shown, which conventionally identify an home zero point of tilt and provide a means for determining the tilt position of specimen positioning module 60 relative to that home zero point.

As previously stated, dewar 155 is positioned and affixed within dewar support housing 150. Primary specimen support 130 is affixed to dewar support housing 150 to provide thermal conductivity and cooling of specimen stage module 140, as will be described further herein. Primary specimen support 130 is itself comprised of thermally conductive support 131 extending spaced apart and axially within primary specimen support housing 132, separated by vacuum. Thermally conductive support 131 extends to a point immediately adjacent the inner chamber 154 of dewar 155 and is thermally isolated from dewar support housing 150 by dewar mounting bushing 165. Dewar heat transfer rod 170 extends inwardly into the dewar chamber 154 and is positioned for direct impingement with the liquid nitrogen media to be contained therein. Dewar heat transfer rod 170 is mounted within thermally conductive support 131 and is in direct thermal communication therewith. Thermally conductive support 131 extends axially from dewar 155 to an internal point of vacuum chamber 55, where it receives and restrains specimen stage module 140, providing both physical support for specimen stage module 140 as well as the heat transfer mechanism for the cooling of the relevant components of specimen stage module 140. Thermally conductive support 131 is supported at the chamber end by rotational support bushing 168. Rotational support bushing 168 is further drilled to permit the vacuum of vacuum chamber 55 to extend into the space between thermally conductive support 131 and specimen support housing 132 within primary specimen support 130. Thermally conductive support 131 is further located at the axis of rotation of specimen positioning module 60. Bellows 145 is provided as the primary translation vacuum seal to the chamber along primary specimen support 130.

Referring now to FIG. 6, as previously described the rotation of rotational support housing 115 causes the entire specimen positioning module 60 to tilt, which in turn provides the tilting function for the positioning of the specimen relative to the ion beams in either of the two ion milling positions. The lateral positioning of the specimen within the ion beams is controlled, as previously described, by the longitudinal displacement of primary specimen support 130, specimen stage module 140 and dewar support housing 150 by the rotation of the lead screw, or threaded drive rod 110 and is previously described in conjunction with rotational displacement motor 120. Dewar support housing 150 and lateral displacement motor 105 are further provided with locational detection means (not shown), which identify points of lateral movement of specimen positioning module 60, including a travel limit detector at each extreme end of travel of primary specimen support 130 as well as the ability to locate within approximately 0.1 mm the lateral movement of primary specimen support 130 as well as the specimen itself within the range of travel.

Referring now to FIGS. 4 and 6, primary specimen support 130 is provided with a hollow bore end 133 in which secondary specimen support 135 is slideably mounted which is further restrained in said bore by specimen holder restraint flange 325. Secondary specimen support 135 is urged to an extreme outward and leftward position, as shown in FIGS. 4 and 6, by specimen holder engagement spring 295. Secondary specimen support 135 when urged into this outward and leftward positioning directly against and adjacent specimen holder restraint flange 325 and is in thermal engagement with thermally conductive support 131 at specimen holder temperature transfer engagement surface 300. To the extent that secondary specimen support 135 is caused to compress specimen holder engagement spring 295, as will be further described herein, and urged away from engagement with specimen holder restraint flange 325 and specimen holder temperature transfer engagement surface 300, then secondary specimen support 135 is no longer within thermally conductive engagement with thermally conductive support 131 and will assume the ambient temperature of its surrounding environment. Secondary specimen support 135 has been provided with the ability to thermally engage and disengage from thermally conductive support 131 for the purpose of selecting either the temperature of thermally conductive support 131 or ambient temperature based upon the position of secondary specimen support and, therefore, specimen stage module 140 within the device. This functionality is directly related to the operation of the load lock as will now be described.

Referring now to FIGS. 4 and 6, a primary functionality of the combined ion mill is the ability to rapidly thin or otherwise mill the specimen utilizing the high energy mill module 70 and subsequently finish the preparation of the specimen, utilizing the low energy ion mill module 75, all within a single vacuum chamber. As previously discussed, the ability to perform both operations without the attendant loss of time related to pumping down a vacuum chamber to achieve the appropriate vacuum in a second device, as well as exposing the specimen to ambient air and temperature, is extremely important. One of the primary timesaving functionalities of the device is the ability to minimize the number of cycles of creating and releasing the vacuum in the vacuum chamber. Consequently, the device is further provided with the ability to insert and remove specimens into the vacuum chamber without need of releasing and recreating the high vacuum state of the vacuum chamber. This is achieved through the use of the load lock 85. Load lock 85 is further provided with load lock cap 280, which is constructed of stainless steel or other material which is sufficient to withstand the presence of the vacuum on the chamber side and ambient air pressure on the external surface. Load lock cap 280 is provided with a hollow center chamber which permits the extension of the relevant portion of specimen stage module 140 to be extended therein when primary specimen support 130 is extended to its leftmost extreme in point, designated as the load/unload position. Load lock cap 280 is supported on load lock cap support rod 285 in a pivotal manner, such that load lock cap 280 maintains some degree of freedom of movement relative to load lock cap support rod 285 and further permitting load lock cap 280 to remain in a precise parallel engagement with endplate 262 at the time of engagement so as to exert even and uniform support on the sealing mechanism material therebetween (not shown). Load lock cap support rod 285 is pivotally attached to endplate 262 and is urged into an engagement position by load lock spring 290. In operation, load lock cap 280 is retained in an engaged position by load lock spring 290 and the presence of a vacuum inside, directly adjacent to low energy milling chamber 265. When primary specimen support 130 and specimen stage module 140 are moved to the extreme left, as shown in FIG. 4, the load/unload position, specimen stage module 140 will extend exterior to low energy milling chamber 265 and into the load lock cap 280. After venting the load lock cap 280, the user may disengage load lock cap 280 from endplate 262 and gain access to specimen stage module 140. At this position, the vacuum inside vacuum chamber 55 and low energy milling chamber 265 is maintained by the engagement of specimen stage engagement surface 311 provided on specimen stage module 140 with the inner wall of endplate 262 immediately adjacent to load lock cap 280 at a point designated as load lock engagement surface 310. Specimen stage engagement surface 311 is provided as a ring collar with a radial seal, provided circumferentially on the exterior surface of specimen stage module 140 and is urged in the load/unload position against load lock engagement surface 310 by the action of specimen stage engagement spring 295. In this manner, the vacuum is maintained within the chambers of the device and the load lock cap 280 may be opened and the specimen exchanged. When the load lock cap 280 is replaced in the operative position and primary specimen support 130 and specimen stage module 140 are moved away from the load/unload or extreme left position, as shown in FIGS. 4 and 6, the vacuum within vacuum chamber 55 and low energy milling chamber 265 may drop slightly, based upon the volume of air contained within the interior of load lock cap 280, but the vacuum within the chambers is normalized more quickly to the target level than would be necessary for the return of vacuum chamber 55 and low energy milling chamber 265 from ambient air pressure.

Additional vacuum is preferably applied directly to the load lock cap 280. Referring to FIGS. 4 and 14, load lock vacuum port 86 communicates directly into the chamber area inside load lock cap 280 when specimen stage module 140 is in the load/unload position and vacuum is provided by roughing pump 93, as will be further described with reference to FIG. 14. Evacuation of the space inside load lock cap 280 by roughing pump 93 alone, prior to the withdrawal of specimen stage module 140 from load lock engagement surface 310, removes a large fraction of the entrapped air and thus minimizes the temporary pressure increase occurring on the retraction of specimen stage module 140 into low energy milling chamber 265.

It is further necessary to thermally disengage secondary specimen support 135 from thermally conductive support 131 during the load/unload operation. If the secondary specimen support 135 were to remain at the cooling temperatures provided by thermally conductive support 131 and the liquid nitrogen media within dewar 155 at the time that the specimen and specimen stage module 140 were introduced to the ambient temperature, then the ambient water vapor, together with all airborne contaminants, such as hydrocarbons in the surrounding laboratory atmosphere would immediately condense and freeze on both the specimen and the equipment, which is undesirable. The combined ion milling device, therefore, provides that at the point of engagement of secondary specimen support 135 with load lock engagement surface 310, secondary specimen support 135 is urged against specimen stage engagement spring 295 and is displaced inwardly within primary specimen support bore 133, disengaging secondary specimen support from specimen stage temperature transfer engagement surface 300 within the bore. This allows the specimen stage module 140 to return to an ambient temperature and reduce condensation and contamination of the specimen upon the opening of load lock cap 280. This process may be assisted by the use of a supplementary heating system within the specimen holder base 305 of specimen stage module 140, as will be more fully described herein.

Figure 8:
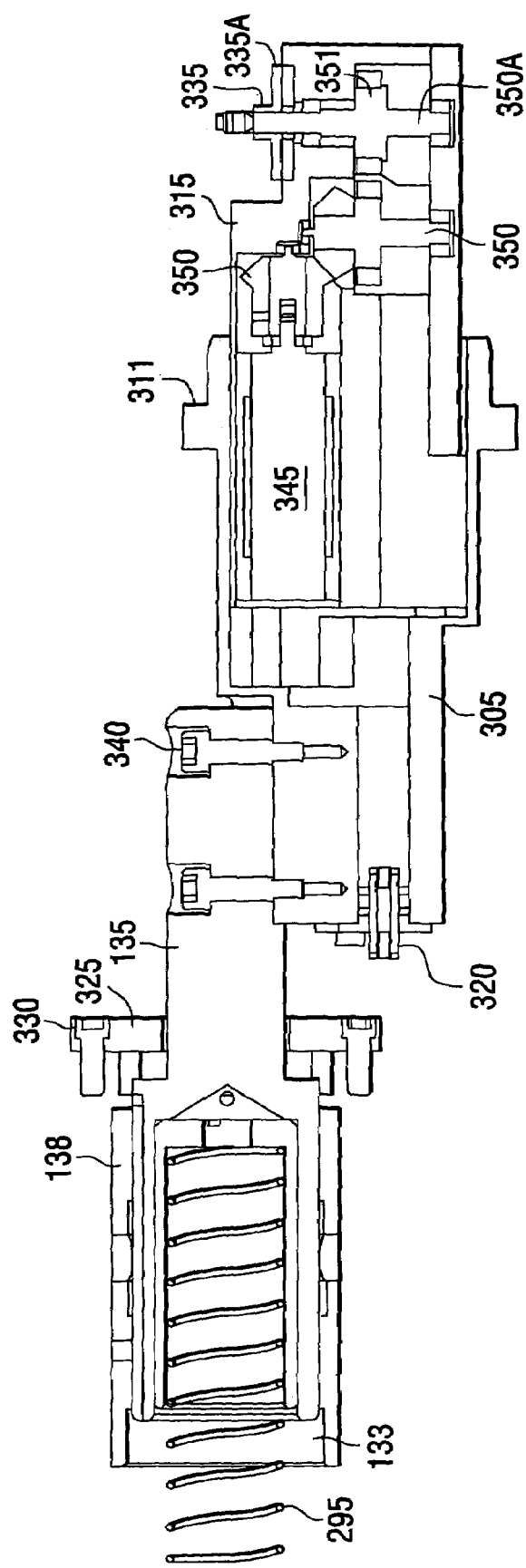
FIG. 8 is a longitudinal sectional view of the specimen stage module of the combined ion milling device.

Referring now to FIG. 8, the operation of specimen stage module 140 is described in further detail. It is to be specifically noted that the orientation of specimen stage module 140 in FIG. 8 is reversed from that shown in FIGS. 4, 5 and 6. As previously described, thermally conductive support 131 is provided with bore 133 into which secondary specimen support 135 is slidably located. In normal operation, specimen stage engagement spring 295 urges second specimen support 135 into an outward position. Secondary specimen support 135 is restrained within primary specimen support bore 133 by specimen stage restraint flange 325. Specimen stage restraint flange 325 is restrained as the end cap of thermally conductive support 131 by bolts 330. Specimen holder base 305 is affixed by bolts 340 to the end of secondary specimen support 135 in an offset manner so as to maintain the location of the specimen at the axis of rotation of thermally conductive support 131, being the tilting of specimen positioning module 60. Contained within specimen holder base 305 is specimen mounting block 315, which itself contains the mechanism for the rotation of the specimen relative to the impingement of the ion milling beam. Specimen holder rotation motor 345 is affixed by a series of rotational drive gears 350 within specimen holder 335. The operation of specimen holder rotation motor 345 is controlled through electrical impulses through electrical connection 320, as previously described, in conjunction with rotational displacement motor 120 and lateral displacement motor 105. Specimen holder rotation motor 345 is provided with an arbitrary end point detection module (not shown) which allows for the precise positioning of the specimen within the 360° of rotational freedom of the specimen stage 335. Specimen holder gear 350A, which directly supports specimen holder 335, is further provided with specimen observation bore 351, which permits the passage of light from end point detection module 230 to reach the underside of the specimen through specimen holder 335.

Figure 8A:
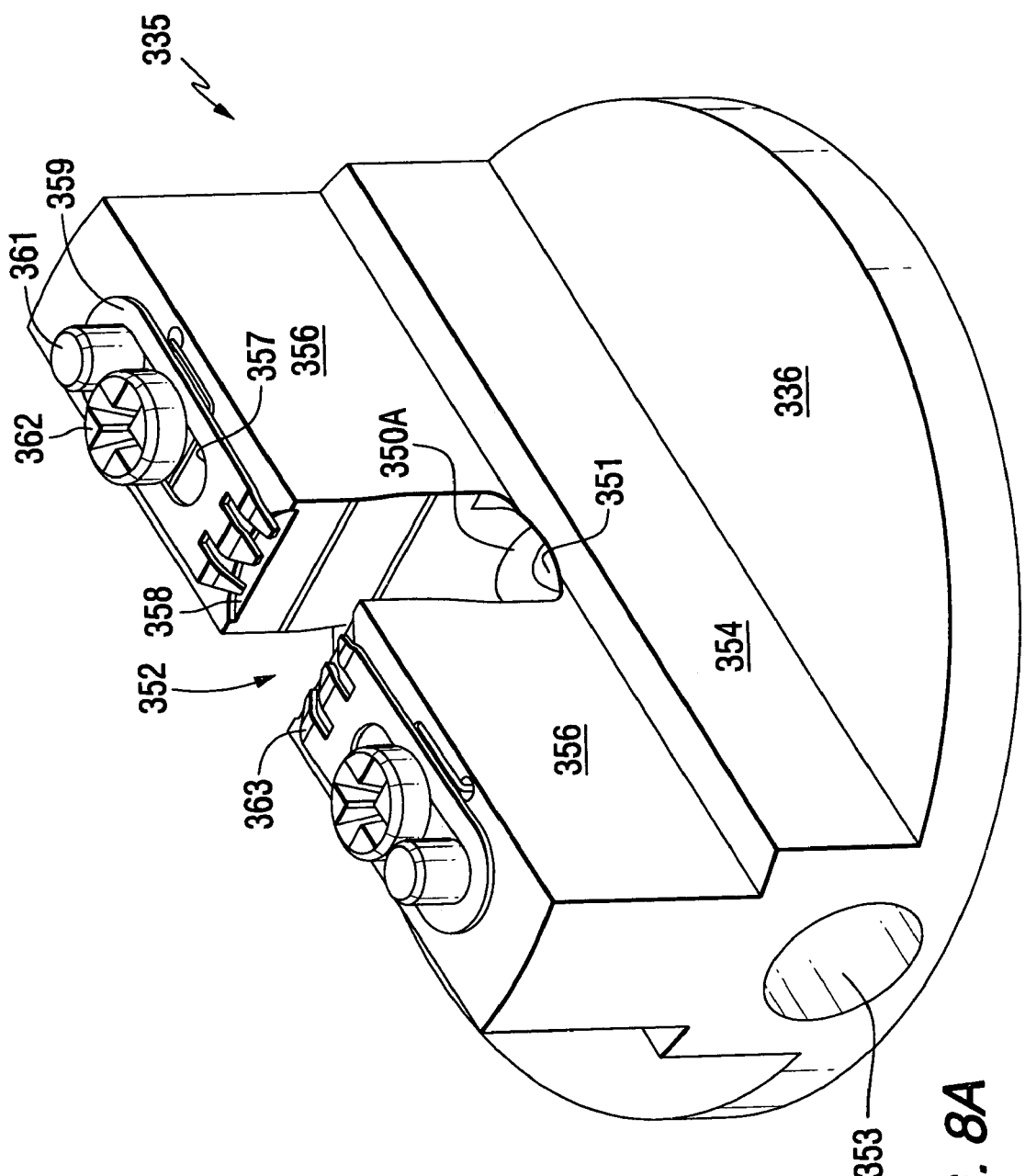
FIG. 8A is an isometric view of the specimen holder.

Referring now to FIG. 8A, specimen holder 335 is further provided with specimen holder base 336, which is circular in shape for easy rotation within holder bore 335A provided in specimen mounting block 315. Specimen holder base 336 is integrally formed with mounting bore boss 354, which extends upwardly therefrom in order to support specimen holder mounting bore 353, which extends axially therethrough. Mounting bore 353 is provided for the insertion of any conventional locking means (not shown) for the temporary and removable affixation of specimen holder 335 to the upper shaft of specimen holder gear 350A, as shown in FIG. 8. Referring again to FIG. 8A, integrally formed with mounting bore boss 354 is specimen holder riser 356, which is divided into two sections by specimen holder milling gap 352. Specimen holder riser 356 is intended to space the actual mounting surface for the specimen some distance away from specimen holder base 336 and mounting bore boss 354 to permit access to the underside of the specimen mounted within specimen mounting recess 358. The specimen is inserted in specimen mounting recess 358, which is sized and curved to accept specimens which are typically on the order of 3 mm in diameter. The specimen is retained in place through the exertion of a downward force thereon by restraining tines 363 of specimen restraining clips 359 against the upper surface of specimen mounting recess 358. Specimen restraining clips 359 are slidably mounted on the upper surface of specimen holder riser 356 for adjustable interaction of the restraining tines 363 with the upper surface of the specimen, such that the specimen is securely restrained, but the tines 363 do not interfere with the regular viewing of the area of interest of the specimen. Each of the specimen restraining clips 359 is provided with a clip adjustment slot 357, which is in turn mounted upon specimen restraining clip mounting pin 361 in each case. In operation, specimen restraining clips 359 may be laterally positioned within the limitation of movement of clip adjustment slot 357 about mounting pin 361. When an appropriate location is identified, mounting screws 362 are tightened, which fixes specimen restraining clips 359 in place. Additional embodiments of specimen restraining clips 359 may include the use of electronic or pneumatic motion systems which would mechanically raise and lower such specimen restraining clips 359 into contact with the specimen.

As previously described during the milling phases of operation of the device, it may be necessary to either view or impinge a beam upon the underside of the specimen. During the two-sided high energy milling process, the underside of the specimen is impinged by the output of one of the high energy ion mill modules 70 as shown in FIG. 4, which passes through specimen holder milling gap 352 to reach the underside of the specimen. Additionally, during such high energy milling, the underside of the specimen may be illuminated by end point detector primary light source 240 and/or visual light source 241 which is utilized for visualization of the specimen during the milling operation. In either instance, the light is passed from lens 255, as shown in FIG. 4, upwardly through the base of specimen holder gear 350A through specimen observation bore 351 as shown in FIGS. 4 and 8 in order to emerge from specimen observation bore 351 at the base of specimen holder milling gap 352 and be projected unto the lower surface of the specimen.

Figure 8B:
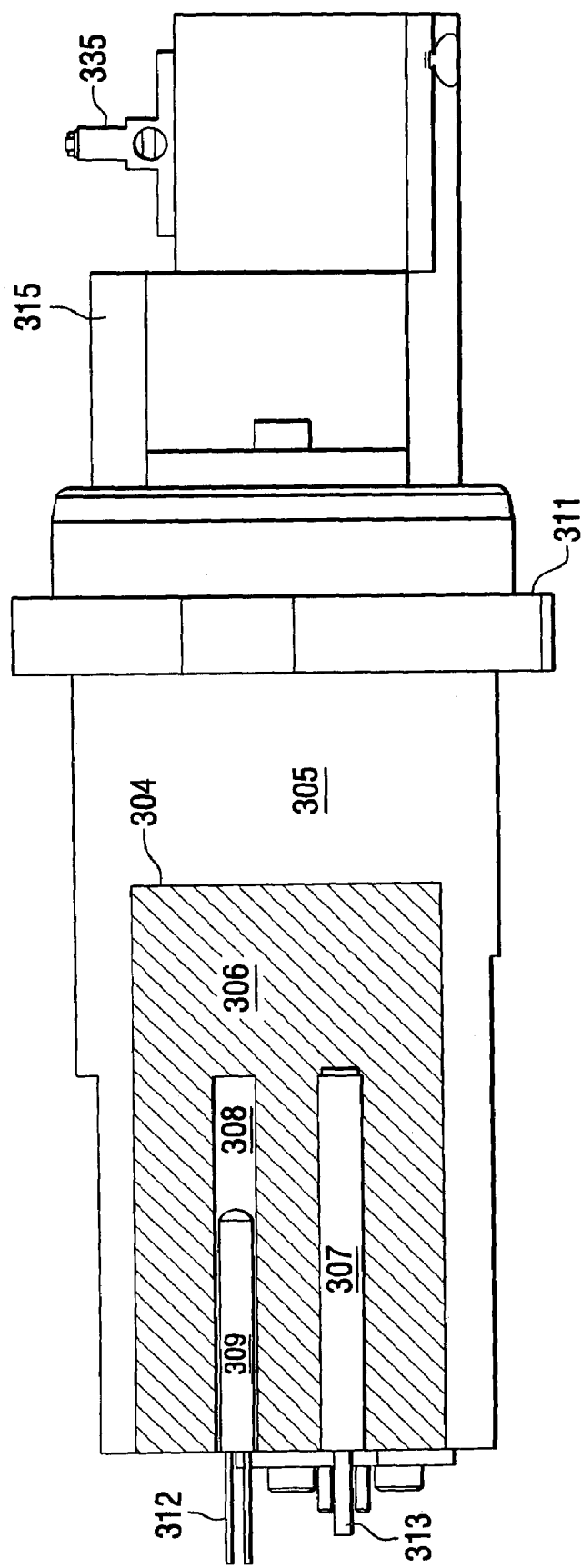
FIG. 8B is an elevational view, partially in section, of the stage holder base.

As previously described, specimen stage module 140 is adapted to engage and disengage from thermally conductive support 131 to allow specimen stage module 140 to return to ambient temperature prior to exposure to the atmosphere when engaged with the load lock module. It is therefore necessary to ascertain the temperature of the specimen stage module 140 to determine the time point at which the specimen stage module 140 reaches a temperature which is appropriate for the opening of load lock cap 280 when specimen stage module 140 is in the load/unload position. Referring now to FIG. 8B, specimen holder base 305 is provided with heater block cavity 304 which contains heat transfer media 306. Provided within heat transfer media 306 is sensor bore 308 which is adapted to receive and restrain temperature sensor 309 which communicates with the central processor through heater connector 313. Temperature sensor 309 is intended for the detection and relay of an appropriate electrical output, which indicates to the central processor the temperature of specimen stage base 305 as well as specimen holder 335.

In many situations, it is advantageous to accelerate the return of specimen holder base 305 to ambient or near ambient temperatures and for that purpose, heater rod 307 is provided embedded within heat transfer media 306. Heater connector 313 provides an electrical connection in an appropriate interface to the central processor, which will activate heater rod 307 and enable the more rapid warming of specimen holder base 305.

Figure 9:
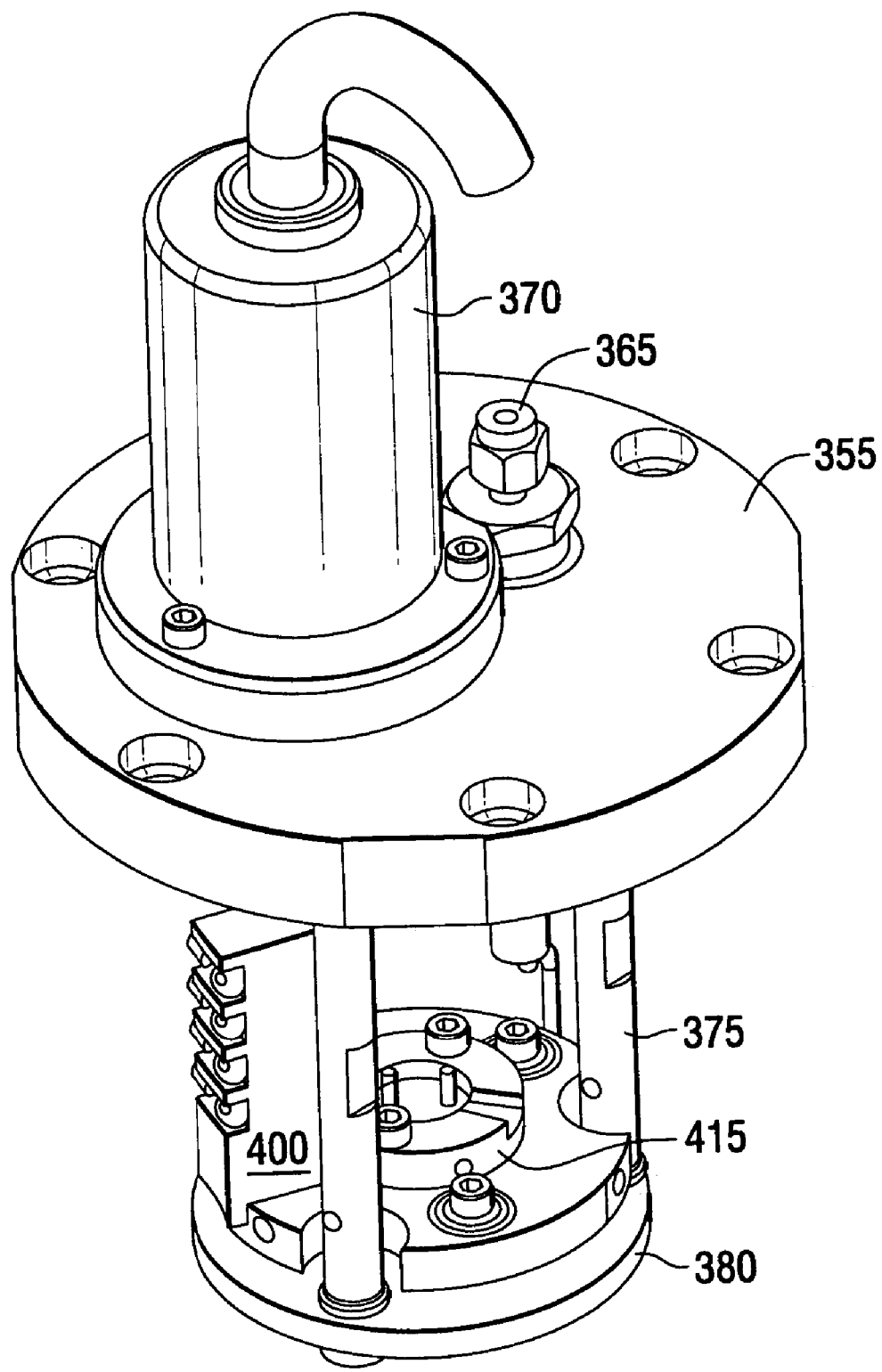
FIG. 9 is an isometric view of the low energy ion mill module.
Figure 10:
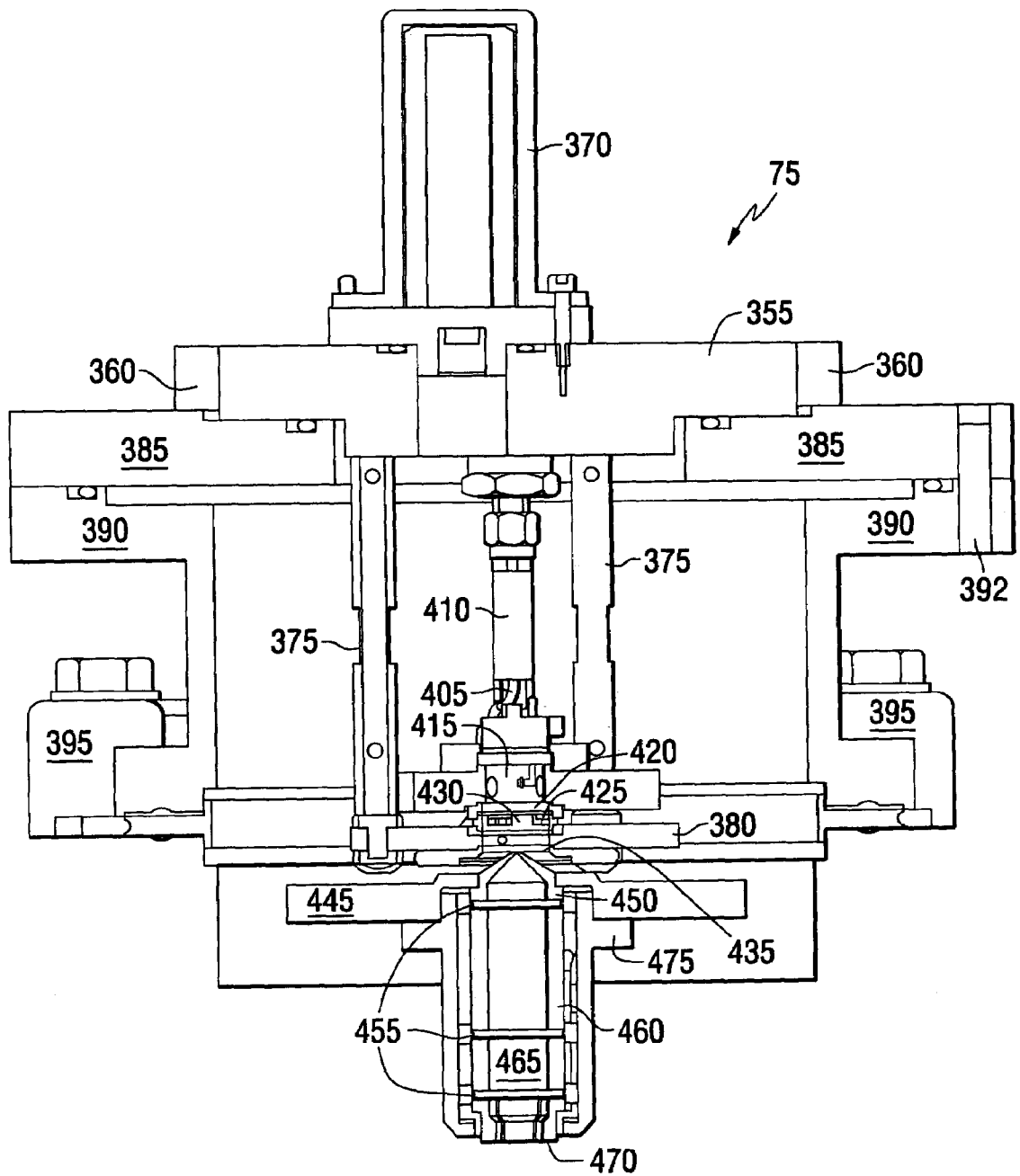
FIG. 10 is a sectional view of the low energy ion mill module including its lens.
Figure 11:
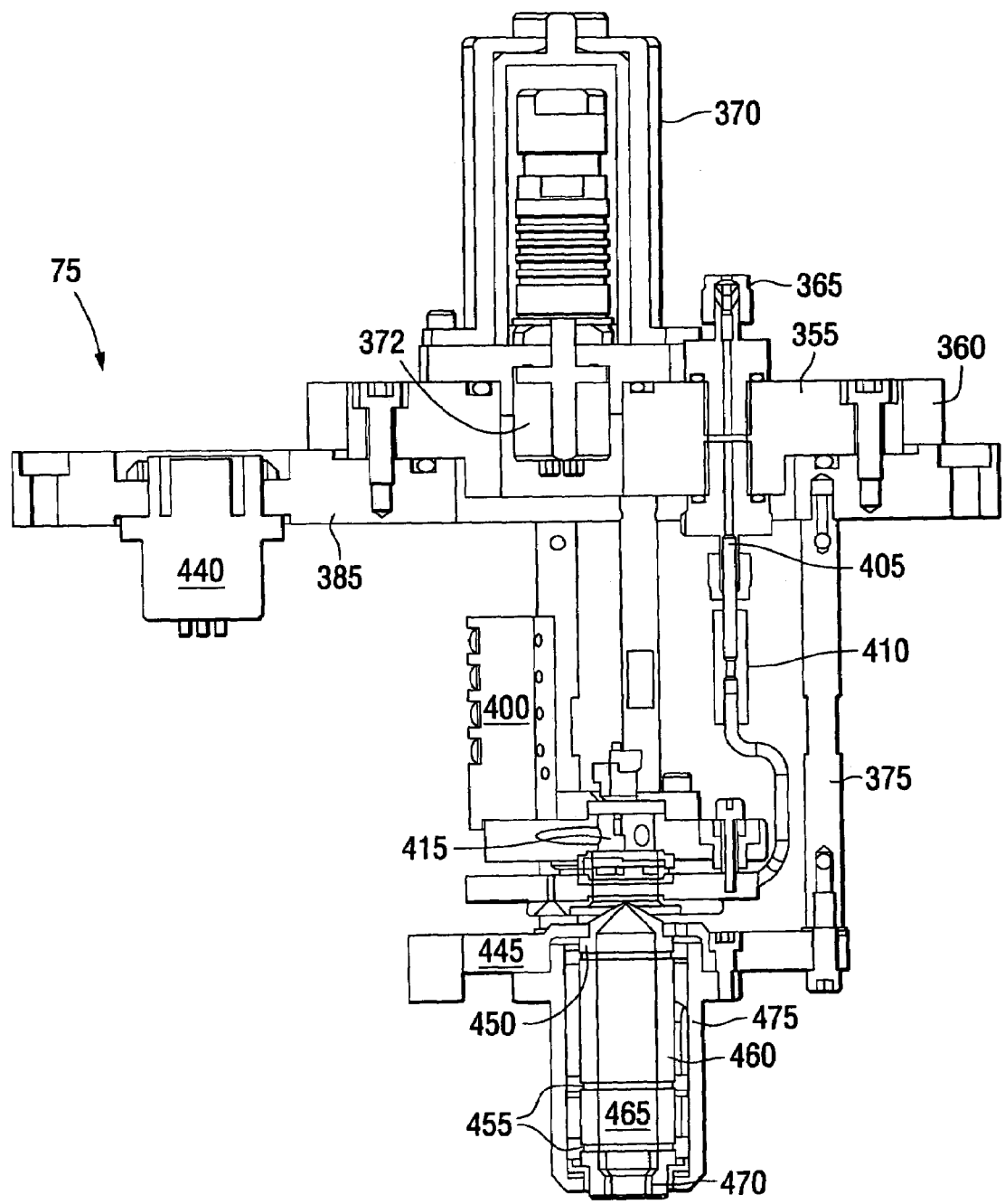
FIG. 11 is a second sectional view of the low energy ion mill module including its lens.

Referring now to FIGS. 9, 10 and 11, low energy ion mill module 75 comprises a carrier assembly, which is comprised of low energy source carrier top flange 385, low energy source carrier 390 and low energy source carrier retaining lugs 395. Referring specifically to FIG. 10, carrier top flange 385 is bolted to low energy source carrier 390 by a series of bolts 392, which are also illustrated with respect to FIG. 5. The assembled carrier is inserted into low energy ion source mounting block 260 and is received and restrained by low energy source carrier restraining lugs 395 which are held in place by bolts. It is to be specifically noted that the design of low energy ion mill module 75 is specifically directed toward the ease of removal and replacement as a self-contained unit, as shown in FIG. 10, for ease of access and maintenance through the engagement of restraining lugs 395 in low energy ion source mounting block 260. Referring now to FIGS. 9, 10 and 11, but most particularly to FIG. 11, all electrical connections for low energy ion mill module 75 are made through internal electric connector 372 and low energy lens connector 440 while the gas connection is made through gas port 365. Removal of low energy ion mill module 75 is therefore facilitated by the quick removal of the electrical and gas connections and the restraining lugs. Referring now to FIG. 9, the core section of the low energy ion mill module is displayed having low energy source housing 355, which supports the majority of the internal components. Flange 355 is indexed so that it may be inserted directly, without adjustment, into low energy source carrier top flange 385 and is restrained by low energy source housing restraint block 360, which is visible with respect to FIGS. 5 and 10. Low energy source electrical connector 370 is affixed to the top of housing 355 to allow the passage of electronic signals therethrough and is shown, with particular reference to FIG. 11, to comprise a quick release connector, which is electrically connected with internal electric connector 372. Internal electric connector 372 allows for the wiring of electrical contact block 400, which transmits electrical impulses from connector 370 to the various components of the low energy ion source, as will be described herein. Referring now to FIG. 9, it is apparent that the low energy source is designed as a self-contained unit which incorporates low energy housing support rods 375 to support and space a filament contained within a filament of support block 415 in an appropriate orientation for interface with the remaining components of the low energy source. Appropriate electrical connection wiring (not shown) provides electrical communication between internal electrical connector 372, filament support block 415 and electrical contact block 400. Referring now to FIGS. 10 and 11, the interface between the low energy milling module and the surrounding housing supporting the lens assembly is apparent. Low energy source housing 355, which supports the filament assembly, is affixed to low energy source carrier top flange 385, which comprises the topmost element of the lens assembly and carrier. The lens assembly is positioned directly adjacent the filament assembly at the lower portion of the filament section and is separately supported in this fashion. Optionally, the filament assembly may be removed alone, or the lens assembly may be removed in conjunction with the filament assembly and the two assemblies may be separated external to the ion milling device for service and access to the various component parts. Both assemblies are further intended to be electrically self-sufficient, in that the removal of each subassembly does not necessitate the removal of additional internal electrical connections to the remaining components of the device as a whole. External low energy lens connector 440 is located within low energy source carrier top flange 385 and provides for easily removable electrical communication between the ion milling device and the central processor and the elements of the lens by conventional wiring (not illustrated for clarity).

Referring now to FIG. 10, the elements of the ion source and lens are described with more particularity. Gas feed line 405 passes from gas port 365 through insulating support rod 410, which is preferably constructed of an insulating material such as Vespel manufactured by DuPont. Gas feed line 405 passes internally of ionization chamber block 380. The filament, which is preferably constructed of tantalum, thoriated iridium or thorium oxide is positioned in a conventional manner within filament block 415. A wehnelt electrode 420 is disposed circumferentially about the base of filament block 415 and contains a bore or passageway for the electrons emitted from the filament to pass therethrough and is to provide for guidance of the emitted electrons into the ionization region at the center of ionization chamber block 380. A pair of intermediate electrodes identified as G2 electrode 425 and G3 electrode 430 are similarly disposed circumferentially about the path of the electrons emitted by the filament element. The gas, preferably argon, is supplied from a conventional gas reservoir 795, the flow of which is controlled and maintained by mass flow controller 790 and computing device 550, as more fully illustrated in FIG. 14. G2 and G3 electrodes 425 and 430, respectively, are utilized to guide the electrons from the filament into the ionization region in the hollow bore of the ionization chamber block 380. An electric field is established within the ionization region by applying a suitable voltage difference, preferably between 1V and 20V, between G3 electrode 430 and exit aperture 435. A portion of the electrons from the filament enter into the ionization region and collide with gas atoms introduced into the ionization region through gas delivery tube 405. A portion of the resultant collisions produce ionized gas atoms, as is well known to those skilled in the art, which are directed toward exit aperture 435 by virtue of the aforementioned electric field. A portion of the ions strike the metal surrounding exit aperture 435 and are neutralized by transfer of electrons with the metal parts, but some of the ions pass through the exit aperture 435 and are therefore directed into the lens. As is also well known to those skilled in the art, this electrode geometry is of a type utilized to produce ions having uniform kinetic energy within a range of plus or minus 2 eV, with a mean energy that is closely related to the bias voltage on the ionization chamber block 380 with respect to the specimen, typically in the range of 10 eV to 6 keV. Voltages are applied to each of the electrodes through connectors 370 and electrical contact block 400, as determined by the user, through the processor interface, as will be described herein. Once the ions emerge from exit aperture 435, they are directed into lens entrance electrode 450, which is provided with a conical bore therein and is electrically grounded. Lens entrance electrode 450 is supported by lens support flange 445, which is in turn supported by low energy housing support rods 375 directly from low energy source carrier top flange 385. The lens elements, including lens entrance electrode 450, lens ground segment 460, lens active segment 465 and deflection segments 470 are all contained within lens housing 475, which is also affixed to lens support flange 455, creating a self-contained unit. Lens active segment 465 is electrically connected through external low energy lens connector 440 to an external power source which is under the control of the central processor, as will be described herein. A voltage is applied to lens active segment 465, proportional to the ion beam energy and generally in the range of approximately 200 to 1000 V, creating an image with ions of exit aperture 435 on the specimen, with a magnification range of approximately 1, i.e., a range of 0.1 to 10. With a suitably sized exit aperture 435, an image or spot size of approximately 1 µm–100 µm is achieved on the specimen surface. The beam passes through the bore of the lens elements to the final section of the lens, deflection segments 470 which provide a rastering function. Deflection segments 470 are a plurality of electrically isolated segments forming a circumferential ring about the path of the beam. Differential voltages are selectively applied to the different electrically isolated deflection segments 470 in order to cause the beam emerging from the lens to be deflected by a desired angle, which is proportional to the differential voltage and generally in the range of 0 to 10 degrees. Angular deflection of the beam at the output of the lens results in a change in the position of the image or spot on the specimen surface. Appropriate electrical controls from the central processor will thus cause the beam to be directed in a pattern across the surface of the specimen, which is located directly below deflection segments 470.

Figure 12:
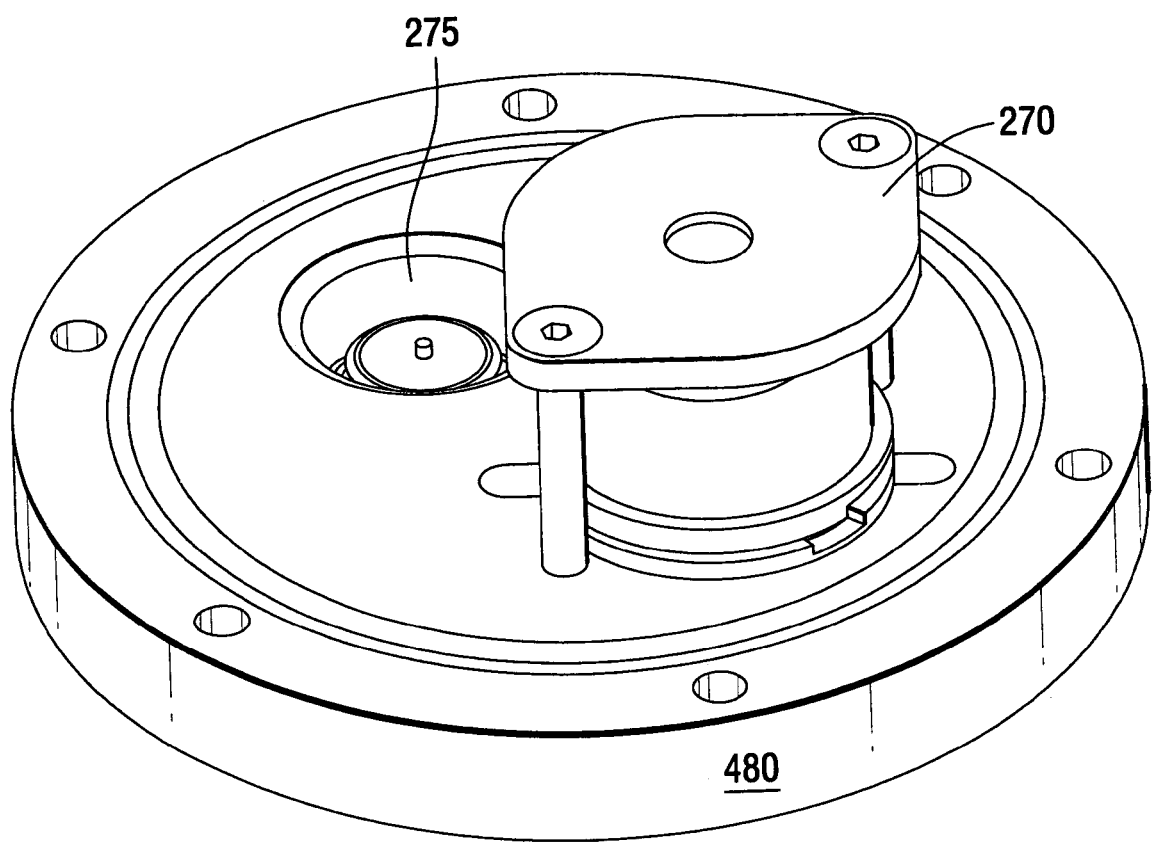
FIG. 12 is an isometric view of the Faraday cup mounting flange.

Referring now to FIGS. 4 and 12, a Faraday cup mounting flange 480 is located in low energy ion source mounting block 260, opposite the low energy ion mill module 75. Faraday cup mounting flange 480 supports Faraday cup 270 and Faraday cup connector 275, which permits the communication of current flow from Faraday cup 270 to the outside environment. Faraday cup 270 is utilized to measure the output of low energy ion mill module 75 in a testing mode when no specimen is present in order to determine the output current of low energy ion mill module 75.

Figure 13:
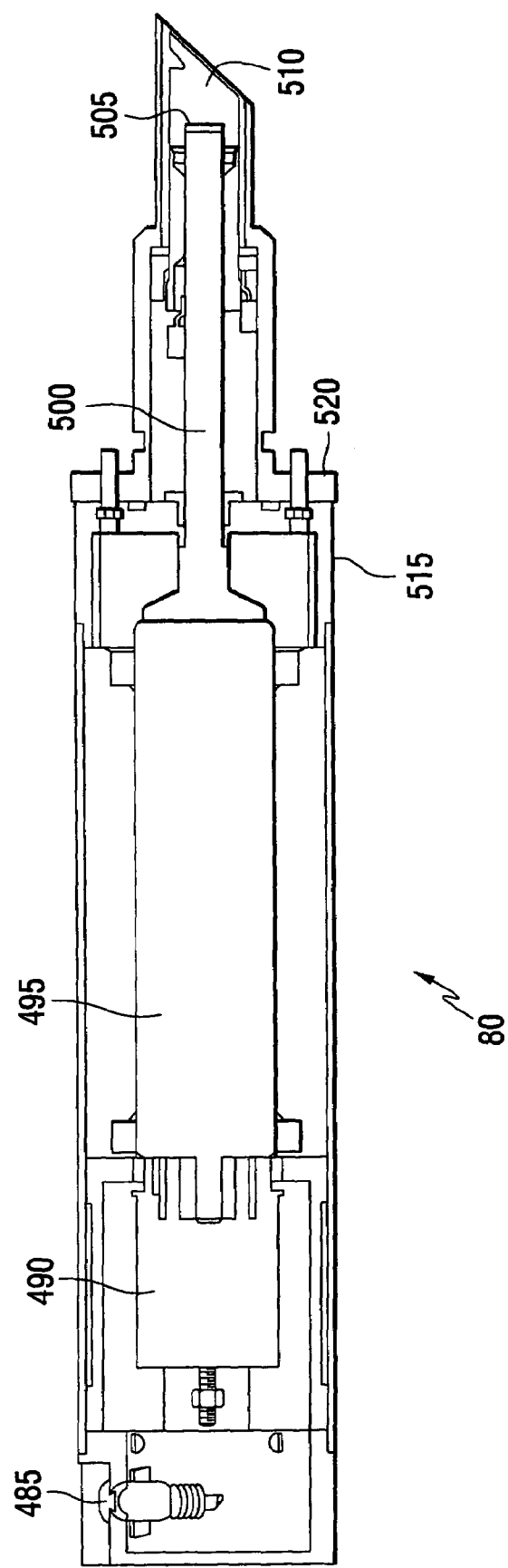
FIG. 13 is a sectional view of the secondary electron detector utilized for imaging the specimen during low energy milling.

Referring now to FIGS. 5 and 13, a secondary electron detector imaging module 80, or SED, is provided for the imaging of the specimen during low energy milling. During the low energy milling process, secondary electrons will be ejected from the surface of the specimen upon the impingement of the ions constituting the low energy milling beam. SED imaging module 80 is mounted with the collection electrode 510 internal to low energy mounting source block 260 within low energy milling chamber 265 immediately adjacent specimen holder module 140 when in the operative position for low energy milling. The secondary electrons are attracted and deflected into SED imaging module 80 by electrode 510 and impinge upon scintillator surface 505 of SED light guide 500. Scintillator surface 505 is held at a high positive potential such as 10 kV with respect to the chamber 265 so that electrons will strike the scintillator 505 with high kinetic energy such as 10 keV. SED mounting flange 520 comprises a housing which receives and supports electrode 510 and light guide 500 to SED housing 515. SED housing 515 supports photomultiplier tube 495 which is powered through electrical connector 485 in electrical communication with the processing and imaging modules described herein. In operation, the secondary electrons impinge upon SED scintillator 505, causing the emission or generation of light signals in proportion to the quantity of secondary electrons impinging thereon. The light signals pass through the SED light guide 500 to photomultiplier tube 495, which converts the light signals into electrical current, proportional to the intensity of incident light. Voltage divider 490 provides a necessary distribution of potentials to the electrodes within the photomultiplier tube 495, as is described and implemented by Hammamatsu Company, Japan. Electrical output of the photomultiplier tube 495, which is substantially proportional to the incident light intensity and therefore substantially proportional to the quantity of collected secondary electrons, is transmitted to the processor through connector 485. A signal processing device, such as a PC or oscilloscope, records the instantaneous position of the incident ion beam on the specimen and also the received SED signal amplitude. If the sample is not homogeneous, the relative production of secondary electrons may differ for different locations of the ion beam image on the sample. In the extreme case, for example, if the sample does not cover the entire deflection area of the incident ion beam, a secondary electron signal will be received when the beam impinges on the sample, and will not be received when the ion beam is positioned on a location at which no sample material is present. In this way a graphical representation or image of the sample represented by the quantity of secondary electrons received by scintillator 505 as a function of beam or the spot position on the sample surface, may be displayed upon screen display 40.

Figure 14:
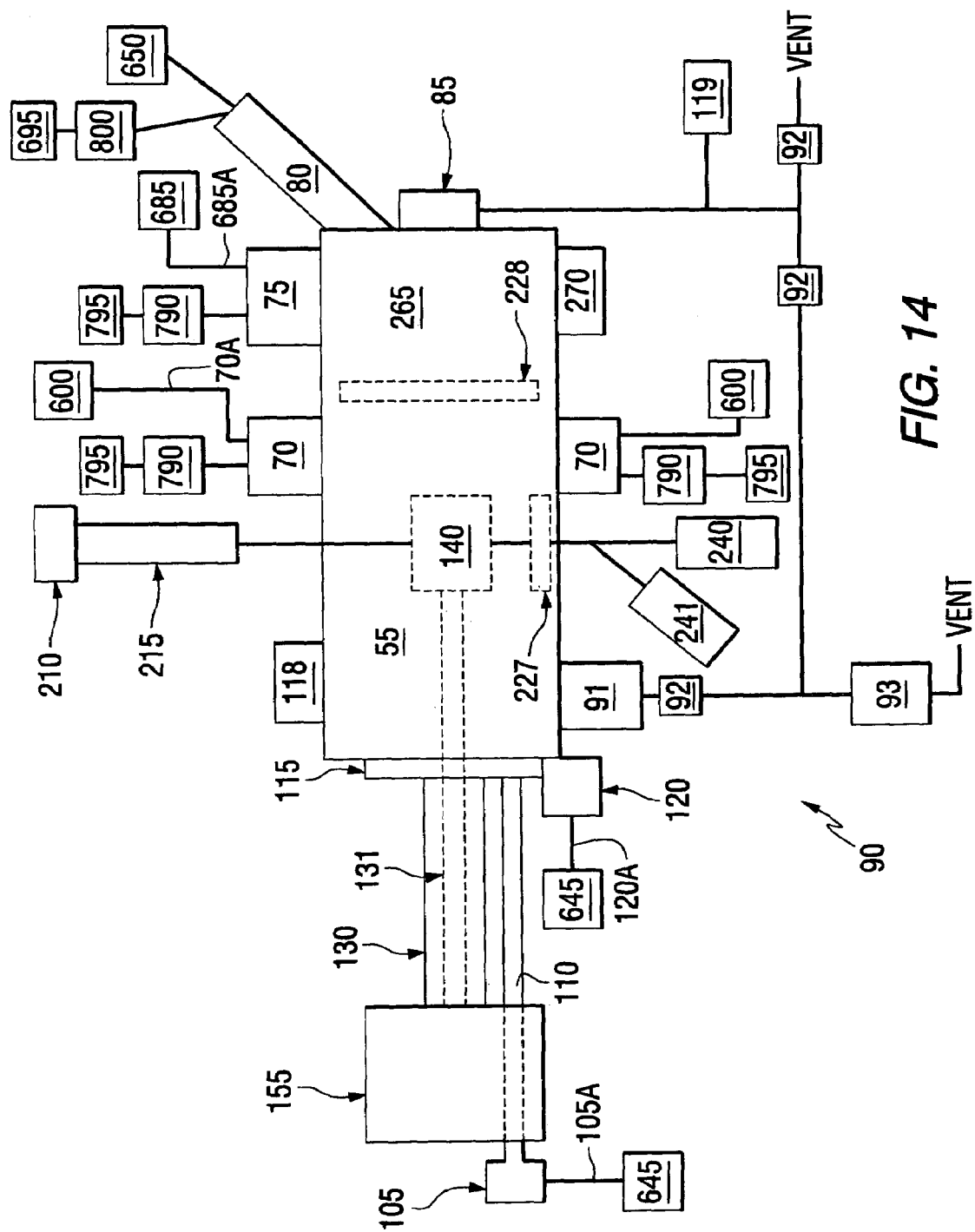
FIG. 14 is a diagrammatic representation of the ion milling device.
Figure 15:
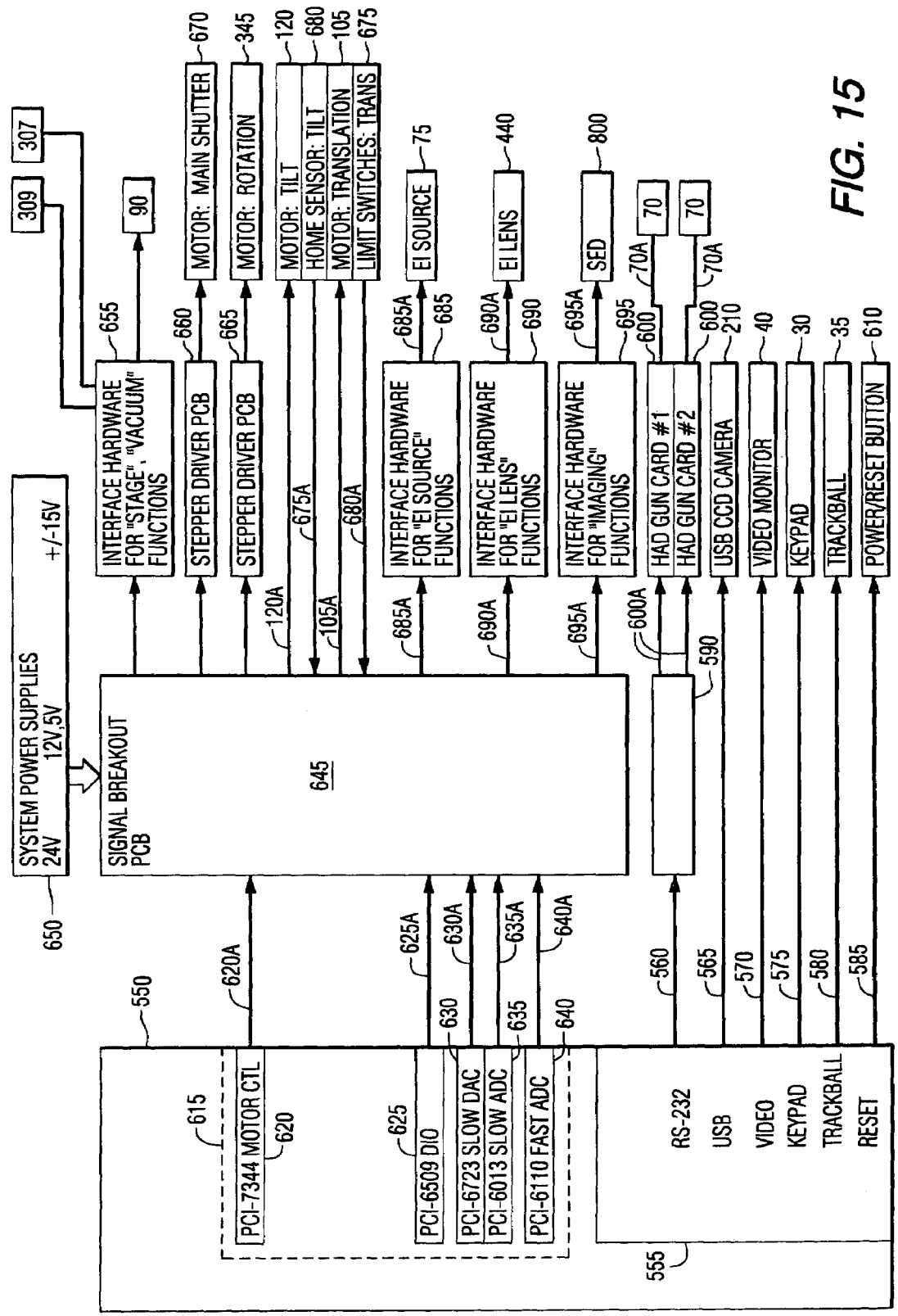
FIG. 15 is a diagrammatic representation of the electrical and processing components of the ion milling device.

Referring now to FIGS. 4, 14 and 15, a computing device 550, which is preferably a Windows-based PC, is provided mounted within cabinet 5. It is constructed having the typical components of processor, memory, data storage and input/output or I/O functions. It is considered well within the skill of those in the art to establish appropriate communications protocols between the commercially available interface cards and circuitry and the various electronic components according to the specific parameters set by the component manufacturers. Computing device 500, as is typical for such devices, may also contain an ethernet or other networking port or connection (not shown) for electronic data communication with other devices on a local or global network. Such communication may be utilized for interchange of data or images, remote operation of the device and remote diagnostic functions, among others.

As is customary with such devices, peripheral control section 555 is provided for communicating with peripheral devices. An RS-232 serial connection 560 is provided for interface and data communication with high energy milling circuit board 590. High energy milling circuit board 590 is utilized to route and translate electronic communication with high energy module interface cards 600 provided for each of high energy ion mill modules 70. Electrical connections 600A and 70A, respectively, provide electronic communication between these components. High energy module interface card 600 is utilized to translate operational instructions from computing device 550 to the hollow anode discharge guns provided within high energy ion mill module 70, which instructions typically take the form of the application or discontinuation of operation, as well as the precise electrical parameters to develop the user pre-selected output. Also controlled is the delivery of the process gas, through the activation of mass flow controller 790. Computing device peripheral control section 555 further provides a serial bus connection 565 which is preferably comprised of a USB port. Serial bus connection 565 may be utilized to communicate with any number of serial devices, but is preferably utilized to communicate with CCD camera 210 for operational control thereof, as well as the receipt of image information from CCD camera 210. Also provided are keypad input connection 575, pointer input connection 580 and power connection 585 which are provided in a conventional manner, as is found on the majority of personal computing devices for user input and machine control. Video output connection 570 is utilized to provide graphical information to screen display 40, also in a conventional manner.

Operational control of combined milling mechanism 15 is provided through the use of a series of interface circuit boards which are typically commercially available, and I/O expansion cards for use with the particular model of computing device 550 selected. The preferred embodiment utilizes PCI bus-based interface cards contained in I/O control section 615. Motor control circuit 620 is provided to translate and generate the appropriate motor control signals from computing device 550 to the various motors identified and utilized within the combined ion milling mechanism 15. The signal path includes direct communication through motor control circuit connection 620A to signal breakout circuit board 645. Signal breakout circuit board 645 is provided as the locus for a variety intermediate circuits within cabinet 5 in order to facilitate the location and mounting of various electronic and mechanical components therein. Signal breakout circuit board 645 also provides operational power to the various motors and peripheral devices utilized in the combined milling mechanism 15. Signal breakout circuit board 645 further contains various discrete circuits with are utilized to route the various identified inputs to the appropriate downstream interface circuitry or mechanical devices, as will be further described herein. With respect to motor control circuit 620, motor control circuit connection 620A provides electronic communication between the appropriate segment of signal breakout circuit board 645 and stage/vacuum circuit 655, shutter driver circuit 660 and rotation motor driver circuit 665, as well as direct communication to rotational displacement motor 120, specimen positioning device location sensor 675, lateral displacement motor 105 and specimen positioning device tilt sensor 680.

More specifically, motor control circuit 620, in conjunction with the appropriate segments of signal breakout circuit board 645, provide electronic communication with shutter driver circuit 660, which interprets and translates electronic communication and instructions to shutter motor 670 contained within chamber shutter assembly 228. Motor control circuit 620 and signal breakout circuit board 645 directly communicate with rotational displacement motor 120 through rotational motor displacement connection 120A for control and operation of the tilting function of the specimen stage. As previously described, specimen positional device location sensor 675 is utilized to detect and identify an arbitrary zero or end point of that tilting movement and communicates such locational information to motor control circuit 620 and computing device 550 through specimen positioning device location sensor connection 675. Likewise, motor control circuit 620 controls and receives communication from lateral displacement motor 105 and specimen positioning device location sensor 675 in a similar manner. Utilizing this circuitry, motor control circuit 620 and computing device 550 control the lateral movement of the specimen stage module and translocate the same through the various milling positions and the load/unload position.

Digital I/O control circuit 625, digital to analog control circuit 630, slow analog to digital control circuit 635 and fast analog to digital control circuit 640, like motor control circuit 620, are provided in the form of PCI-based interface cards in conjunction with computing device 550. These commercially available devices are utilized in conjunction with the appropriate sections of signal breakout circuit board 645 in the passage and translation of electronic data and power to and from the various electronic components. In this manner, computing device 550 through signal breakout control circuit 645 and stage/vacuum interface circuit 655, can receive electronic output signals from temperature sensor 309, convert the data output of temperature sensor 309 into an appropriate temperature measurement scale, and display such output on screen display 40, as will be described further herein.

Stage/vacuum interface circuit 655 further provides an actuation circuit for heater rod 307 located within specimen stage module 140 for the adjustment of the specimen temperature during the load/unload sequence as previous described. The utilization of this circuitry further permits computing device 550 to allow the user to preset or program certain conditions based upon the achievement of a certain target temperature or to initiate certain conditions such as activation of the heater rod 307 when certain temperature conditions are not met. Stage/vacuum interface circuit 655 also controls the operation of turbomolecular pump 91, roughing pump 93 and associated vacuum valves 92, as will be more fully described herein with particular reference to FIG. 14. Under normal operating circumstances, vacuum chamber 55 is evacuated through the use of vacuum pump module 90, which is itself comprised of turbomolecular pump 91 and roughing pump 93. Roughing pump 93 is necessary to create an initial base vacuum from which turbo molecular pump 91 may begin operation. Turbomolecular pump 91 is typically not capable of drawing a vacuum from ambient air pressure. Vacuum valve 92 is disposed between turbomolecular pump 91 and roughing pump 93 to permit roughing pump 93 to be operated independently of turbomolecular pump 91. As previously described in conjunction with the load lock 85, roughing pump 93 may be utilized to evacuate the chamber created in load lock 85 during the load/unload sequence. In this situation, the vacuum valve between turbomolecular pump 91 and roughing pump 93 is closed while vacuum valve 92 located between load lock 85 and roughing pump 93 is open. During all other operation of the combined milling mechanism 15, this load lock vacuum valve 92 remains closed. Load lock vacuum sensor 119 is provided to determine when the appropriate vacuum has been achieved within load lock cap 280. With respect to both the load lock operation as well as the normal pumping of vacuum chamber 55, appropriate vacuum valves 92 are provided to permit the venting of the chambers and the exhaust of pumped air in conjunction with appropriate valves.

Returning to FIGS. 4, 14 and 15, computing device 500, through I/O control section 615, further controls the operation of low energy ion mill module 75 and the associated SED imaging module 80. Computing device 550, through signal breakout circuit board 645, is in operational communication with low energy ion mill module interface circuit 685, which is utilized to control low energy ion module 75 and, more particularly, the ion source contained therein. Low energy ion mill module interface circuit connections 685A provide for the routing of electronic communications thereto and permit the control of power being applied to the filament support block 415, the wehnelt electrode 420, the G2 and G3 electrodes 425 and 430, respectively, and exit aperture 435. Control of the device is maintained through the transmission of user preset signals which monitor the current flow to the various components.

Similarly, low energy ion mill lens interface circuit 690, in conjunction with connection 690A, provides similar control for the various components of the low energy source. Electronic communication is provided through external low energy lens connector 440 and electronic signals from computing device 550 are utilized to control electronic current flow and deflection through signal breakout control circuit 645 to lens active segment 465 and deflection segment 470. Also controlled is the delivery of the process gas, through the activation of mass flow controller 790.

Computing device 550 utilizes I/O control section 615 in order to operate and receive graphic images from SED imaging module 80 through the use of SED imaging module interface circuit 695. The interface 695 provides the ability for computing device 550 to initiate operation of SED imaging module 80, as well as receive the output therefrom, which has been amplified by SED amplifier 800 before returning for interpretation by computing device 550 and the projection of a graphical representation thereof on screen display 40.

Figure 16:
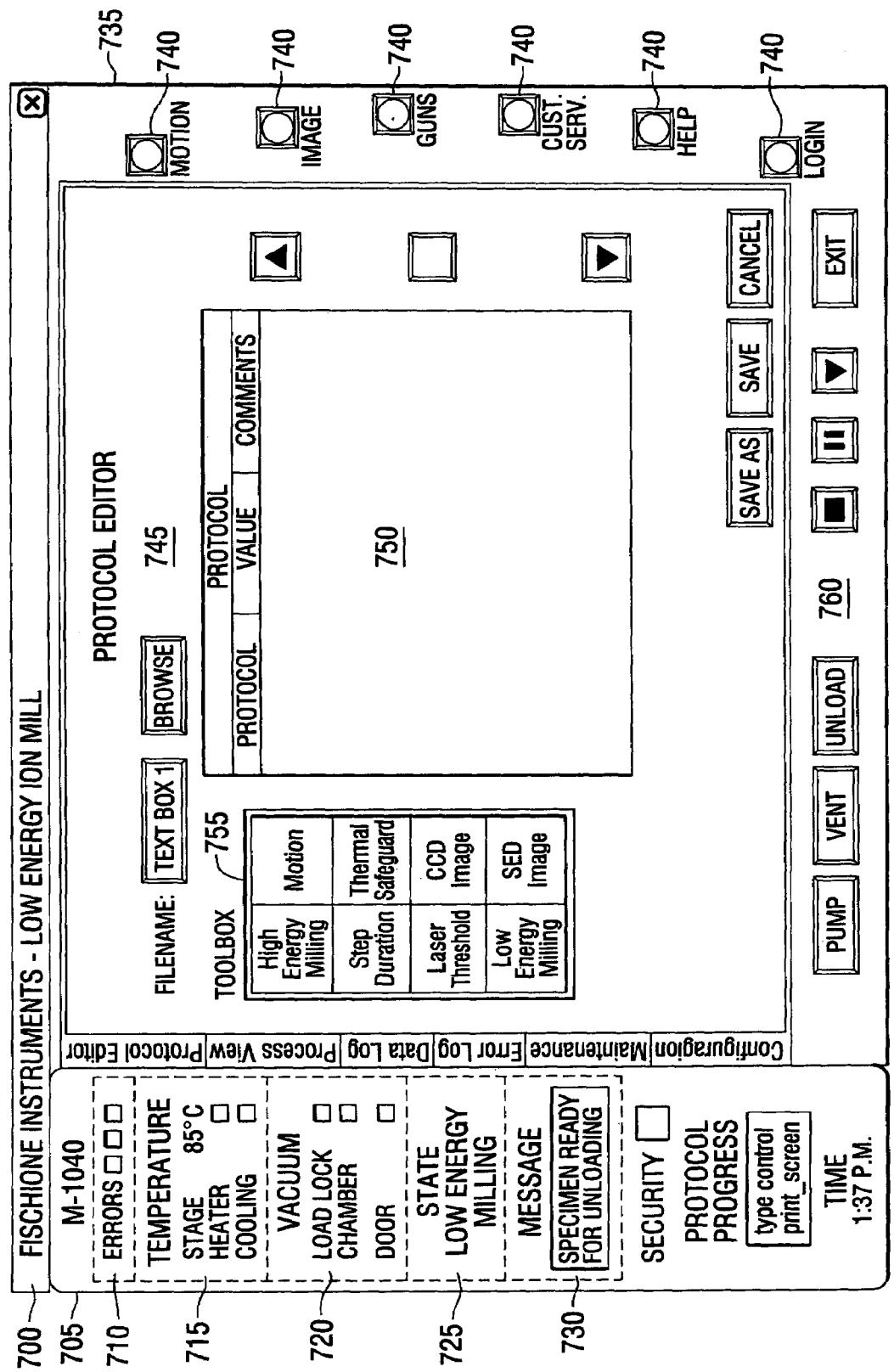
FIG. 16 is a graphic representation of the main input screen display.

Referring now to FIG. 16, a graphical representation is made of a typical main screen display 700 which is utilized to provide an interface between the user and device. Main screen display 700 is intended to permit the user to select various functions of the combined milling mechanism 15 as well as observe a variety of images and data output in order to monitor the progress of the milling functions. Main screen display 700 is provided with status bar display 705 which contains a series of sections which report the status of the various operational devices utilized in conjunction with the combined milling mechanism 15. It is to be specifically understood that main screen display 700 may be utilized in a variety of formats as is well known in the art, and may be oriented in any fashion suitable to the designer.

Status bar display 705 contains error indicator section 710 which may utilize a series of indicator icons or other textual output which may indicate an error or fault condition. Specimen stage temperature status section 715 displays the current temperature of specimen holder block 305, and consequently, the specimen, as determined from temperature sensor 309 as well as the activation status of heater rod 307. Additionally, specimen stage temperature status section 715 may contain information relating to the engagement of thermally conductive support 131 with specimen stage module 140, indicating that the cooling capacity of the liquid nitrogen media contained in dewar 155 is being applied to specimen stage module 140, as appropriate. Vacuum/load lock status section 720 typically provides a boolean output indicating the condition of presence or absence of appropriate vacuum in the load lock, the chamber, and the open or closed status of load lock 85. This information is detected from chamber vacuum gauge 118, load lock vacuum sensor 119, and an interface switch (not shown) which is activated upon the engagement of load lock cap 280 with end plate 262. Activity status section 725 indicates the position and activity of specimen holder module 140 with respect to either high energy ion mill module 70, low energy ion mill module 75, load lock 85, or in a resting position. Activity status section 725 further indicates whether high energy ion mill module 70 or low energy mill module 75 is in an active condition.

Message section 730 may be utilized for communication of a variety of messages including status, help, or other conditions of the device. Main screen display 700 further contains and displays activity buttons 740 which are utilized to access additional menus and command dialog boxes from which certain operations or sequences may be initiated or tracked. These may include maintenance, calibration, and other functions utilizing a series of screen displays which are purely factual in nature and within the ambit of those skilled in the art. The activity buttons 740 are typically contained within an activity bar display 735 which is utilized to provide a degree of organization to main screen display 700. With respect to screen displays, of particular interest are activity scheduler screen 745 and motion control display 765 as shown in FIG. 17.

Referring now to activity scheduler screen 745 as shown in FIG. 16, this screen provides the ability to program a series of algorithmic steps into the device to allow the user to program and initiate a sequence of events which will be automatically carried out by the device without additional user input or supervision. These protocols may be saved and stored as necessary for repeated operation or modification. Activity scheduler screen 745 is provided having an activity list screen 750 in which the various steps of the procedure are displayed after selection and addition by the user. The various operations that may be included in the activity list screen 750 are contained as buttons in activity selector display 755. These include the selection of high energy milling, low energy milling, movement of the specimen between the various stations and load lock, imaging of the specimen at the two milling stations, the operation of the vacuum components as well as the ability to set certain end points and conditions for each operation. These end points and conditions include end point detection for high energy milling as described with reference to end point detector primary light source 240, a preset time duration for any milling operation, and certain temperature parameters as detected by temperature sensor 309. Each of these commands and parameters may be input in any order, although it should be obvious to one skilled in the art that certain activities may take place only after the completion of other prerequisite steps.

Main screen display 700 is further provided with vacuum control bar 760 which permits manual control of the various pumping activities of vacuum pump module 90, the component turbomolecular pump 91 and component roughing pump 93, as well as the initiation of the load/unload sequence.

Figure 17:
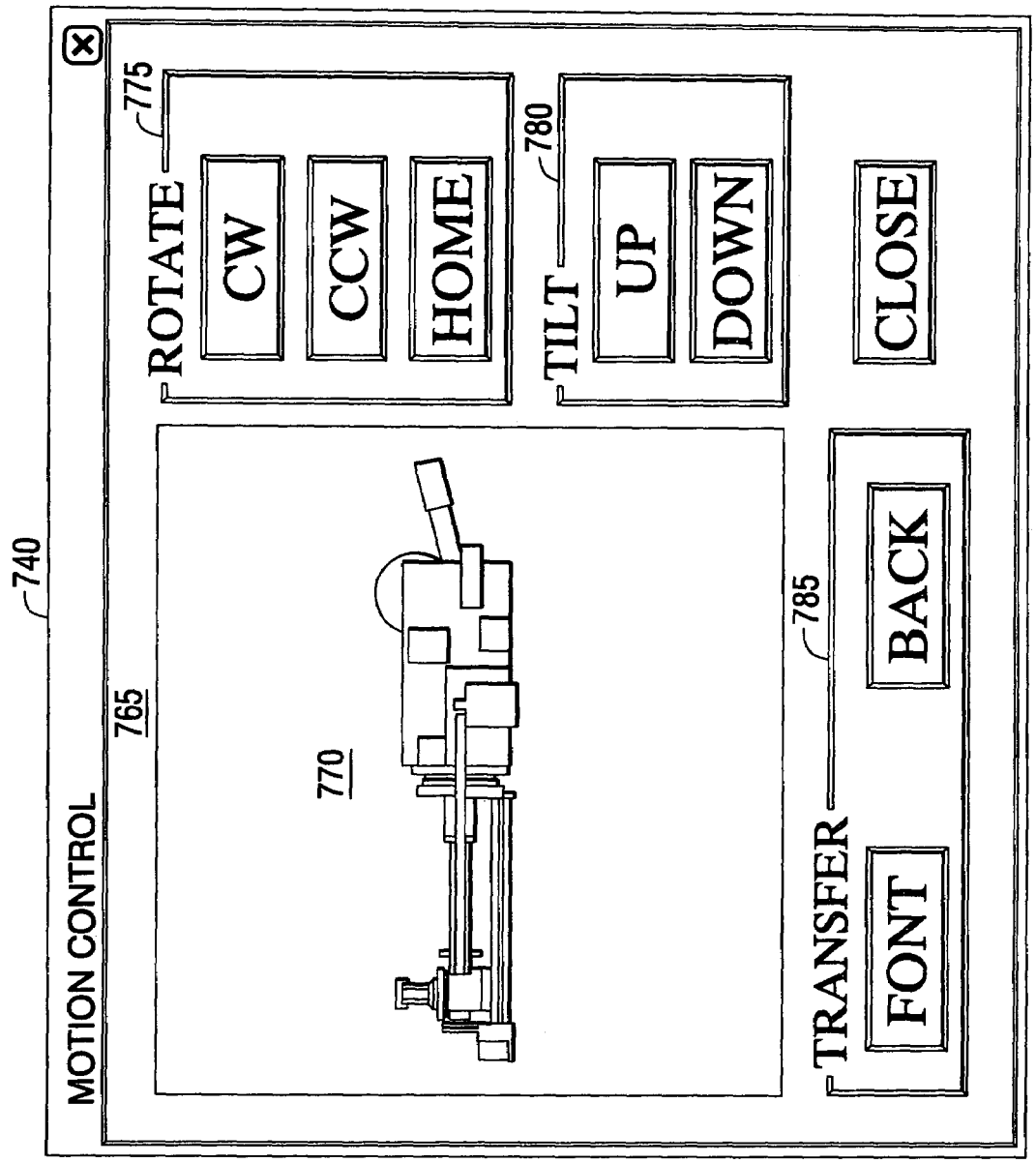
FIG. 17 is a graphic representation of the specimen holder motion control screen display.

Referring now to FIG. 17, precise manual control of specimen stage module 140 is obtained through the use of motion control display 765, which is one of activity buttons 740 selectable from main screen display 700. Motion control display 765 includes motion control status display 770 which provides a graphical representation of the location and condition of the various components of combined milling mechanism 15. Actual control of the device is provided through holder rotation control bar 775 for the circular rotation of specimen holder 335. Specimen holder 335 may be rotated either clockwise or counterclockwise through the use of appropriate controls within holder rotation control bar 775, as well as returning specimen holder 335 to the arbitrary zero point as provided through the end detection means described previously.

Stage tilt control bar 780 allows for manual control of the tilt of specimen stage module 140 through the rotation of specimen positioning module 60, as previously described. The use of appropriate buttons or icons allow the user to engage the rotation of specimen positioning module 60 in either of two arbitrarily identified directions. The translocation or lateral movement of specimen positioning module 60 is controlled through the buttons contained within stage lateral displacement control bar 785, which engages lateral displacement motor 105 for the appropriate movement of specimen holder module 140 between the various stations, a rest position and the load/unload position.

It is to be specifically noted that one skilled in the art might select any one of a number of different graphical representations to engage and monitor the electrical and mechanical operation of the various components of the device.

In operation, the device is initiated by powering up computing device 550 and ensuring that appropriate liquid nitrogen media is placed within dewar 155 through dewar access panel 25. The operation of computing device 550 is observed and initiated through the use of screen display 40, keyboard 30 and pointing device 35 in a conventional manner well known within the skill of those in the art in the utilization of PC-based computing devices. Main screen display 700 is utilized to initiate and/or access the appropriate operational parameters of the device. A vacuum condition within chamber 55 and low energy milling chamber 265 must be established, although this may take place before or after the loading of the initial specimen. In either event, the appropriate control is selected from vacuum control bar 760 to initiate the pumping sequence. The vacuum status is indicated by vacuum/load lock status section 720, and when appropriately indicated, the remaining steps of the procedure may be initiated. In single operation, which is provided as an exemplar of all operations, both manual and programmed, specimen stage module 140 is laterally transferred into the appropriate load/unload position through stage lateral displacement control bar 785. As previously described, the initiation of this sequence causes lateral displacement motor 105 to move specimen positioning module 60 into the load/unload position. The movement of specimen stage module 140 into the load/unload position further causes the disengagement of secondary specimen support 135 from thermally conductive support 131 at specimen holder temperature transfer engagement surface 300, allowing specimen holder stage 140 to return to ambient temperature. As necessary, the operation of heater rod 307 may be initiated through the appropriate commands (not shown) to cause specimen stage module 140 to more quickly return to an ambient temperature. The status of such temperature change is indicated in specimen stage temperature status section 715 of main screen display 700.

Once specimen stage module 140 has engaged in the load/unload position and the temperature of specimen stage module 140 has achieved ambient temperature, the chamber within load lock cap 280 is vented to the use of the appropriate command on vacuum control bar 760. As previously described, the operation of the vacuum and venting processes include the initiation of a base vacuum by roughing pump 93 and the utilization of turbomolecular pump 91 to establish a more significant vacuum as set by the operating parameters. The established vacuum within load lock cap 280 is vented through the opening of the appropriate valve, and an indication of ambient pressure within load lock cap 280 is displayed within vacuum/load lock status section 720. Load lock cap 280 may then be disengaged from end plate 262 and the specimen inserted within specimen mounting recess 358 and restrained by specimen restraining clips 359. It is to be specifically noted that specimen holder 335 may require modification for the use of alternatively shaped specimens, but such modifications are within the ambit of those skilled in the art. Additionally, interchangeable specimen holders 335 may be utilized by alternative mounting upon specimen stage gear 350A through the use of appropriate mounting devices.

Having affixed the specimen in an appropriate position on specimen holder 335, load lock cap 280 is replaced in parallel engagement with end plate 262, and an appropriate command is issued through vacuum control bar section 760 to evacuate load lock cap 280 to an appropriate vacuum level. Once this is achieved, as indicated in vacuum/load lock status section 720, and the pump has established the appropriate vacuum, specimen positioning module 60 may be laterally displaced to place the specimen in an appropriate position within combined milling mechanism 15 for one of the two available milling operations. Movement of specimen positioning module 60 is initiated through the use of stage lateral displacement control bar 785 on motion control display 765. The displacement of specimen positioning module 60 away from engagement in the load/unload position allows secondary specimen support 135 to re-engage thermally conductive support 131 at specimen holder temperature transfer engagement surface 300. The interface of secondary specimen support 135 with thermally conductive support 131 causes specimen stage module 140 to be cooled by the liquid nitrogen media contained within dewar 155. The status of the temperature of specimen holder module 140 is illustrated within the specimen stage temperature status section 715 of main screen display 700, along with an indicator identifying the cooling function.

Under normal conditions, a specimen is first grossly thinned utilizing high energy ion mill module 70, and then finished utilizing low energy ion mill module 75. In that situation, specimen positioning module 60 is activated through stage lateral displacement control bar 785 to the appropriate position as displayed in motion control status display 770 within high energy ion mill module 70. The milling parameters are defined by the user, and may be manually or programmatically controlled. These include time of milling, tilt and rotation of the specimen during the milling operation, the intensity of the ion impingement beam, temperature parameters for the specimen, selection of the process gas and the intensity of the end point detection illumination which will discontinue the operation of the milling procedure. These parameters are all identified and set through the use of main screen display 700, motion control display 765, or additional parameter displays (not shown) which would be conventional numeric displays. With respect to the rotation of the specimen, control of specimen holder 335 is initiated through stage rotation control bar 775, as previously described. The tilt function is also controlled by stage tilt control bar 780 while operation electrical parameters are controlled through activity selector display 755. In the event that a multiplicity of procedures are contemplated to be conducted under programmatic control, each step of the algorithm is input into activity list screen 750 through the use of appropriate commands and parameters selected through activity selector display 755 and the appropriate submenus contained therein. The operation of such a programmed algorithm may be initiated manually or may be saved to a data file for repeated or later use.

The operation of low energy ion mill module 75 is analogous to the operation of high energy ion mill module 70 other than the need to laterally translocate specimen stage module 140 to the appropriate position through the use of stage lateral displacement control bar 785. As with high energy milling, low energy milling may be conducted in conjunction with a variety of motion parameters including tilt and rotation of the specimen. It is also contemplated that either module may be separately applied, as necessitated by circumstances.

In either sequence, images of the milling operations may be viewed in real time on screen display 40, as well as stored in appropriate data files, as either still or full motion images, according to conventional imaging storage techniques and formats. Selection of the various screen displays related to imaging and motion are controlled through the use of activity button 740 in activity bar display 735.

At the conclusion of milling operations, specimen holder module 140 is returned to the load/unload position and the procedure detailed previously regarding the loading of the specimen is repeated. In this manner, a sequence of specimens may be processed through combined milling mechanism 15 without the need to recreate the vacuum conditions within vacuum chamber 55 and low energy milling chamber 265.

While a present preferred embodiment of the invention is described, it is to be distinctly understood that the invention is not limited thereto, but may be otherwise embodied and practiced with the scope of the following claims.

What is claimed is:

1. A device for the selective removal of material from a specimen utilizing ion impingement, comprising:
    a vacuum chamber;
    an ion source module mounted within said vacuum chamber, said ion source module capable of generating at least one beam of ions having an effective continuous energy range from 10 eV to 1 keV within a beam diameter of less than 0.5 mm; and
    a stage for supporting and manipulating said specimen within said vacuum chamber for selective impingement of said at least one beam of ions upon said specimen under vacuum.

2. A device as described in claim 1, wherein said ion source further comprises separable ion generating source and lens components.

3. A device as described in claim 2, wherein said ion generating source component further comprises at least one circumferential electrode through which the ions are passed.

4. A device as described in claim 3, wherein said at least one circumferential electrode further comprises a wehnelt electrode.

5. A device as described in claim 3, wherein said at least one circumferential electrode further comprises at least one constraining electrode for maintaining the path of the ions to a lens component.

6. A device as described in claim 2, wherein said lens component further comprises at least one electrified segment and at least one ground segment.

7. A device as described in claim 6, wherein said lens component further comprises at least one deflecting segment for modifying the path of the ion beam.

8. A device as described in claim 7, wherein said deflected beam may be rastered across the surface of the specimen.

9. A device as described in claim 1, wherein said ion beam diameter is within the range of 1 µm to 0.5 mm.

10. A device as described in claim 9, wherein said ion beam diameter is approximately 20 µm.

11. A device as described in claim 1, wherein said ion beam diameter is approximately 20 µm with a beam energy in the range of 10 eV to 6 keV.

12. A device as described in claim 11, wherein said ion beam diameter is approximately 20 µm with a beam energy in the range of 10 eV to 1 keV.

13. A device as described in claim 1, wherein said ion source comprises a plurality of ion sources.

14. A device as described in claim 13, wherein said plurality of ion sources are located within a single vacuum chamber.

15. A device as described in claim 13, wherein said plurality of ion sources further comprises at least one low energy gun and at least one high energy gun.

16. A device as described in claim 15, wherein said at least one low energy gun and said at least one high energy gun have overlapping energy ranges, providing a continuous energy range.

17. A device as described in claim 16, wherein said continuous energy range is from 10 eV to 6 keV.

18. A device as described in claim 16, wherein said continuous energy range is from 10 eV to 1 keV.

19. A device as described in claim 15, wherein said at least one high energy gun is a hollow anode discharge ion gun.

20. A device as described in claim 19, wherein said at least one high energy gun further comprises two hollow anode discharge ion guns disposed opposite each other.

21. A device as described in claim 20, wherein one of said two hollow anode discharge ion guns is focused on an upper surface of a specimen to be milled and the other of said two hollow anode discharge ion guns is focused on a lower surface of said specimen.

22. A device as described in claim 1, wherein said device further comprises a load lock.

23. A device as described in claim 22, wherein said load lock further comprises a load lock vacuum chamber which can be evacuated and vented separately from said vacuum chamber of said device.

24. A device as described in claim 22, wherein said load lock provides access to said specimen stage external to said device while said specimen stage is in a load position.

25. A device as described in claim 24, wherein said load lock provides access to said specimen stage external to said device while said specimen stage is in a load position and a vacuum condition is maintained within said vacuum chamber.

26. A device as described in claim 1, wherein said specimen stage in a load position provides a seal for said vacuum chamber.

27. A device as described in claim 1, further comprising a cooling system for reducing the temperature of the specimen and specimen stage.

28. A device as described in claim 27, wherein said cooling system further comprises a reservoir of cooling medium.

29. A device as described in claim 28, wherein said cooling medium is selectively thermally connected to said specimen stage.

30. A device as described in claim 28, wherein said specimen stage may be selectively disengaged from said cooling medium.

31. A device as described in claim 28, wherein said specimen stage may be selectively disengaged from said cooling medium while engaged with a load lock, which provides access to said specimen stage external to said device while said specimen stage is in a load position.

32. A device as described in claim 28, wherein said specimen stage is selectively disengaged from said cooling medium by engaging said load lock in said load position.

33. A device as described in claim 28, wherein said specimen stage further comprises a resilient connector between said specimen stage and said cooling medium.

34. A device as described in claim 33, wherein said resilient connector biases said specimen stage into thermal connection with said cooling medium.

35. A device as described in claim 33, wherein said resilient connector is compressed by the engagement of said specimen stage with a load lock, which provides access to said specimen stage external to said device while said specimen stage is in a load position.

36. A device as described in claim 35, wherein said compression of said resilient connector disengages said specimen stage from thermal connection with said cooling medium.

37. A device as described in claim 1, wherein said vacuum chamber is selectively divided into a plurality of component vacuum chambers, each associated with one of a high energy ion source and a low energy ion source.

38. A device as described in claim 37, wherein said vacuum chamber is selectively divided by a motorized shutter.

39. A device as described in claim 1, further comprising a vacuum pumping system.

40. A device as described in claim 39, wherein said vacuum pumping system further comprises a main pump and a roughing pump.

41. A device as described in claim 40, said main pump is a turbomolecular pump.

42. A device as described in claim 39, wherein said vacuum pumping system is oil-free.

43. A device as described in claim 40, wherein said roughing pump is in separate vacuum communication with a load lock.

44. A device as described in claim 1, further comprising at least one imaging module for observation of the specimen during milling mounted within said vacuum chamber.

45. A device as described in claim 44, wherein said at least one imaging module is selected from the group consisting of optical, electro-optical or electronic microscopic devices.

46. A device as described in claim 45, wherein said at least one imaging module is a CCD device.

47. A device as described in claim 46, wherein said CCD device is provided with zoom imaging capabilities.

48. A device as described in claim 46, wherein said CCD device is utilized in conjunction with a high energy ion source.

49. A device as described in claim 45, wherein said at least one imaging module is a secondary electron detector.

50. A device as described in claim 49, wherein said secondary electron detector is further comprised of an electrode, a scintillator and a photomultiplier tube.

51. A device as described in claim 49, wherein said secondary electron detector is utilized in conjunction with a low energy ion source.

52. A device as described in claim 1, wherein said specimen stage further comprises a heating element.

53. A device as described in claim 1, wherein said specimen stage further comprises a temperature sensor.

54. A device as described in claim 1, wherein said specimen stage further comprises a specimen holder for supporting and restraining said specimen.

55. A device as described in claim 1, wherein said specimen holder may be rotated.

56. A device as described in claim 55, wherein said specimen holder is rotated by a motor contained within said specimen stage.

57. A device as described in claim 1, wherein said specimen holder may be tilted within the range of 0 to 45 degrees with respect to the ion beam.

58. A device as described in claim 1, wherein said specimen holder is supported by said stage and said stage may be tilted.

59. A device as described in claim 1, wherein said specimen stage is supported by a positioning module.

60. A device as described in claim 59, said positioning module further comprising a support cradle.

61. A device as described in claim 60, wherein said specimen stage is slidably affixed to said support cradle.

62. A device as described in claim 60, wherein said specimen stage may be longitudinally displaced along said cradle.

63. A device as described in claim 62, wherein said positioning module further comprises a motor for longitudinally displacing said specimen stage along said cradle.

64. A device as described in claim 59, wherein said positioning module may be tilted.

65. A device as described in claim 64, wherein said positioning module further comprises a motor for tilting said specimen stage and said cradle.

66. A device as described in claim 59, wherein said positioning module further comprises at least one sensor for locating the position of said specimen stage on said cradle.

67. A device as described in claim 59, wherein said positioning module further comprises at least one sensor for identifying the tilt position of said specimen stage.

68. A device as described in claim 1, further comprising a computing device for selective operation of said device.

69. A device as described in claim 68, wherein said computing device is in electronic communication with said ion source module.

70. A device as described in claim 69, wherein said computing device is utilized to control said ion source module.

71. A device as described in claim 68, wherein said computing device is utilized to locate said specimen holder with respect to said ion source module.

72. A device as described in claim 68, wherein said computing device is utilized to displace said specimen with respect to said ion source beam of ions.

73. A device as described in claim 68, wherein said computing device is in electronic communication with at least one imaging module for observing the specimen during milling.

74. A device as described in claim 73, wherein said computing device is utilized to control said imaging module.

75. A device as described in claim 73, wherein said computing device is utilized to display the output of said imaging module.

76. A device as described in claim 68, wherein said computing device may be utilized to program an operational algorithm which automatically performs the ion milling functions of the device.

77. A device as described in claim 68, wherein said computing device may be utilized to program an operational algorithm which automatically performs the milling, imaging, vacuum and specimen manipulation functions of the device.

78. A method for the selective removal of material from a specimen utilizing ion impingement, comprising the steps of:

applying at least one ion beam having an energy level of between 10 eV and 1 keV to the surface of said specimen; and focusing said at least one ion beam onto an impingement spot having a diameter of less than 0.5 mm.

79. A method as described in claim 78, further comprising the step of deflecting the path of the ion beam, causing said beam to be rastered across the surface of the specimen.

80. A method as described in claim 79, wherein said ion beam impingement spot diameter is within the range of 1 µm to 0.5 mm.

81. A method as described in claim 78, wherein said ion beam impingement spot diameter is approximately 20 µm.

82. A method as described in claim 78, wherein said ion beam impingement spot diameter is approximately 20 µm with a beam energy in the range of 10 eV to 6 keV.

83. A method as described in claim 78, wherein said ion beam diameter is approximately 20 µm with a beam energy in the range of 10 eV to 1 keV.

84. A method as described in claim 78, wherein said applying step further comprises a plurality of applications of ion beams on said specimen.

85. A method as described in claim 84, wherein said plurality of applications are conducted within a single vacuum chamber.

86. A method as described in claim 85, wherein said plurality of applications further comprises the application of at least one low energy beam and at least one high energy beam.

87. A method as described in claim 86, wherein said at least one low energy beam and said at least one high energy beam have overlapping energy ranges, providing a continuous energy range.

88. A method as described in claim 87, wherein said continuous energy range is from 10 eV to 6 keV.

89. A method as described in claim 88, wherein said continuous energy range is from 10 eV to 1 keV.

90. A method as described in claim 86, wherein the application of said at least one high energy beam further comprises two beams disposed opposite each other.

91. A method as described in claim 90, wherein one of said beams is focused on an upper surface of a specimen to be milled and the other of said beams is focused on a lower surface of said specimen.

92. A method as described in claim 78, wherein the step of applying the ion beam further comprises the step of controlling said application with a computing device.

93. A method as described in claim 78, further comprising the step of sealing said specimen within a closed vacuum chamber.

94. A method as described in claim 93, wherein the step of sealing said specimen within a closed vacuum chamber further comprises the step of controlling said sealing with a computing device.

95. A method as described in claim 78, further comprising the step of placing the specimen under vacuum prior to applying the ion beam.

96. A method as described in claim 95, wherein said step of placing the specimen under vacuum comprises evacuating said vacuum chamber with a pump.

97. A method as described in claim 95, wherein the step of placing said specimen under vacuum further comprises the step of controlling said placing with a computing device.

98. A method as described in claim 95, wherein said step of placing the specimen under vacuum comprises evacuating said vacuum chamber with a roughing pump and then further evacuating said vacuum chamber with a primary pump.

99. A method as described in claim 95, further comprising the step of passing the specimen through a load lock prior to placing the specimen under vacuum.

100. A method as described in claim 95, wherein the step of placing the specimen under vacuum further comprises the step of separately evacuating the load lock.

101. A method as described in claim 93, further comprising the step of extracting said specimen from said chamber subsequent to said application of said ion beam.

102. A method as described in claim 78, further comprising the step of cooling the specimen and specimen stage during the application of the ion beam.

103. A method as described in claim 78, further comprising the step of warming the specimen and specimen stage prior to extraction from the vacuum chamber.

104. A method as described in claim 78, further comprising the step of monitoring the temperature of said specimen stage.

105. A method as described in claim 78, further comprising the step of cooling the specimen and specimen stage during the application of the ion beam and the step of warming the specimen and specimen stage prior to extraction from the vacuum chamber wherein said warming step is initiated by physical contact of the specimen stage with a load lock.

106. A method as described in claim 78, further comprising the step of cooling the specimen and specimen stage during the application of the ion beam and the step of warming the specimen and specimen stage prior to extraction from the vacuum chamber wherein said cooling step is initiated by cessation of physical contact of the specimen stage with a load lock.

107. A method as described in claim 78, further comprising the step of selectively dividing the vacuum chamber during application of the ion beam.

108. A method as described in claim 78, further comprising the step of observing the specimen during the application of the ion beam.

109. A method as described in claim 78, further comprising the step of recording images of said observation of said specimen.

110. A method as described in claim 78, further comprising at least one of an observing of the specimen and a recording of images of the specimen, wherein at least one of said observing and recording steps utilizes at least one imaging module is selected from the group consisting of optical, electro-optical or electronic microscopic devices.

111. A method as described in claim 110, wherein at least one of said observing and recording steps comprises the step of controlling said observing and recording with a computing device.

112. A method as described in claim 78, further comprising the step of rotating the specimen during the application of said ion beam.

113. A method as described in claim 78, further comprising the step of tilting the specimen during the application of said ion beam between the angles of 0 and 45 degrees with respect to said ion beam.

114. A method as described in claim 78, further comprising the step of detecting the location of the specimen with respect to the ion beam.

115. A method as described in claim 78, further comprising the step of detecting the orientation of the specimen with respect to the ion beam.

116. A method as described in claim 114, wherein the location of the specimen is controlled by a computing device.

117. A method as described in claim 78, wherein the focusing of said ion beam is controlled by a computing device.

118. A method as described in claim 117, further comprising the step of programming an operational algorithm which automatically performs the ion milling functions of the device.

119. A method as described in claim 118, further comprising the step of Further comprising the step of executing such operational algorithm.

120. A method as described in claim 117, further comprising the step of programming an operational algorithm which automatically performs the milling, imaging, vacuum and specimen manipulation functions of the device.

121. A method as described in claim 120, further comprising the step of executing such operational algorithm.

\* \* \* \* \*

UNITED STATES PATENT AND TRADEMARK OFFICE
CERTIFICATE OF CORRECTION

PATENT NO. : 7,132,673 B2
APPLICATION NO. : 10/903657
DATED : November 7, 2006
INVENTOR(S) : Fischione et al.

It is certified that error appears in the above-identified patent and that said Letters Patent is hereby corrected as shown below:

Column 13, line 33, "and is in" should read --is in --.

Column 21, line 32, after "variety" insert -- of --.

Column 21, line 38, delete "with" and insert -- which --.

Column 27, line 28m delete "with" and insert -- within --.

Column 32, line 55, after "module" delete -- is --.

Column 34, line 4, delete "Further comprising the step of".

Signed and Sealed this

Twenty-ninth Day of May, 2007

JON W. DUDAS
*Director of the United States Patent and Trademark Office*